United States Patent
Wang et al.

(10) Patent No.: US 12,557,244 B2
(45) Date of Patent: Feb. 17, 2026

(54) TWO-PHASE IMMERSION COOLING SYSTEM AND HEAT CONDUCTION DEVICE THEREOF

(71) Applicant: Wiwynn Corporation, New Taipei (TW)

(72) Inventors: You-Cheng Wang, New Taipei (TW); Kang-Bin Mah, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 225 days.

(21) Appl. No.: 18/476,502

(22) Filed: Sep. 28, 2023

(65) Prior Publication Data
US 2025/0016959 A1    Jan. 9, 2025

(30) Foreign Application Priority Data
Jul. 3, 2023   (TW) ................................ 112124806

(51) Int. Cl.
*H05K 7/20* (2006.01)

(52) U.S. Cl.
CPC .................................... *H05K 7/203* (2013.01)

(58) Field of Classification Search
CPC ........................ H05K 7/203; H05K 7/20409; F28D 15/0275; H01L 23/427
See application file for complete search history.

(56) References Cited

U.S. PATENT DOCUMENTS

| | | | |
|---|---|---|---|
| 4,743,369 A * | 5/1988 | Geermans ............... | B01D 29/27 |
| | | | 210/167.29 |
| 2006/0118280 A1* | 6/2006 | Liu ......................... | F28F 3/022 |
| | | | 165/104.33 |

(Continued)

FOREIGN PATENT DOCUMENTS

| CN | 104115578 A | 10/2014 |
|---|---|---|
| TW | M610267 U | 4/2021 |

(Continued)

OTHER PUBLICATIONS

Examination report dated Apr. 16, 2024, listed in related Taiwan patent application No. 112124806.

(Continued)

*Primary Examiner* — Lionel Nouketcha
(74) *Attorney, Agent, or Firm* — McClure, Qualey & Rodack, LLP

(57) ABSTRACT

A two-phase immersion cooling system includes a work tank, a device to be cooled, and a heat conduction device. The work tank has a vapor section and a liquid-phase section to contain a liquid-phase working fluid. At least one portion of the device to be cooled is in the vapor section. The heat conduction device including a heat conduction element and a boiling-assisting structure has a closed space to contain a heat conduction fluid to have the heat conduction fluid flow inside the closed space. The heat conduction element has a first section in the liquid-phase section and a second section connected to the at least one portion of the device to be cooled. The boiling-assisting structure is connected to the first section and exposed to the liquid-phase section of the work tank, thereby causing bubble nucleation at a heterogeneous interface between the boiling-assisting structure and the liquid-phase working fluid.

26 Claims, 23 Drawing Sheets

(56) References Cited

U.S. PATENT DOCUMENTS

| | | | | |
|---|---|---|---|---|
| 2013/0083485 | A1* | 4/2013 | Tong | H01L 23/427 |
| | | | | 361/700 |
| 2013/0175021 | A1* | 7/2013 | Takigawa | F28F 3/02 |
| | | | | 165/185 |
| 2014/0218859 | A1 | 8/2014 | Shelnutt et al. | |
| 2020/0408467 | A1* | 12/2020 | Zaghlol | H01L 23/427 |
| 2022/0408612 | A1* | 12/2022 | Peterson | H05K 7/20318 |
| 2023/0156960 | A1* | 5/2023 | Ramakrishnan | H05K 7/20809 |
| | | | | 361/679.53 |
| 2023/0189478 | A1* | 6/2023 | Kelley | H05K 7/203 |
| | | | | 165/104.22 |

FOREIGN PATENT DOCUMENTS

| | | | |
|---|---|---|---|
| TW | 202301962 A | 1/2023 |
| TW | I805871 B | 6/2023 |

OTHER PUBLICATIONS

Examination report dated Aug. 14, 2025, listed in related Taiwan patent application No. 112124806.

* cited by examiner

TWO-PHASE IMMERSION COOLING SYSTEM AND HEAT CONDUCTION DEVICE THEREOF

CROSS-REFERENCE TO RELATED APPLICATION

This non-provisional application claims priority under 35 U.S.C. § 119 (a) to patent application No. 112124806 filed in Taiwan, R.O.C. on Jul. 3, 2023, and the entire contents of which are hereby incorporated by reference.

BACKGROUND

Technical Field

The instant disclosure relates to an immersion cooling system, particularly an immersion cooling system having a heat conduction device. The instant disclosure also relates to a heat conduction device, particularly a heat conduction device for an immersion cooling system.

Related Art

In the immersion cooling system known to the inventor, component(s) to be cooled is usually immersed in the working fluid completely to cool the component(s) to be cooled effectively.

SUMMARY

According to some embodiments, an immersion cooling system is provided, and the immersion cooling system comprises a work tank, a device to be cooled, and a heat conduction device. The work tank has a vapor section and a liquid-phase section. The liquid-phase section is adapted to contain a liquid-phase working fluid. At least one portion of the device to be cooled is in the vapor section. The heat conduction device comprises a heat conduction element and a boiling-assisting structure. The heat conduction element has a first section and a second section, wherein the first section is in the liquid-phase section, and the second section is connected to the at least one portion of the device to be cooled. The boiling-assisting structure is on the first section.

Furthermore, according to some embodiments, a heat conduction device for an immersion cooling system is provided, and the immersion cooling system has a vapor section, a liquid-phase section, and a device to be cooled, wherein at least one portion of the device to be cooled is in the vapor section. The heat conduction device comprises a heat conduction element and a boiling-assisting structure. The heat conduction element has a first section and a second section, wherein the first section is in the liquid-phase section, and the second section is connected to the at least one portion of the device to be cooled. The boiling-assisting structure is on the first section.

Moreover, according to some embodiments, a heat conduction device is provided, and the heat conduction device comprises a heat conduction element and a boiling-assisting structure. The heat conduction element is adapted to contain a heat conduction fluid and has a first section, a second section, and a boiling-assisting structure. The second section is away from the first section and adapted to be connected to a device to be cooled. The boiling-assisting structure is connected to the first section.

DETAILED DESCRIPTION

Figure 1A:
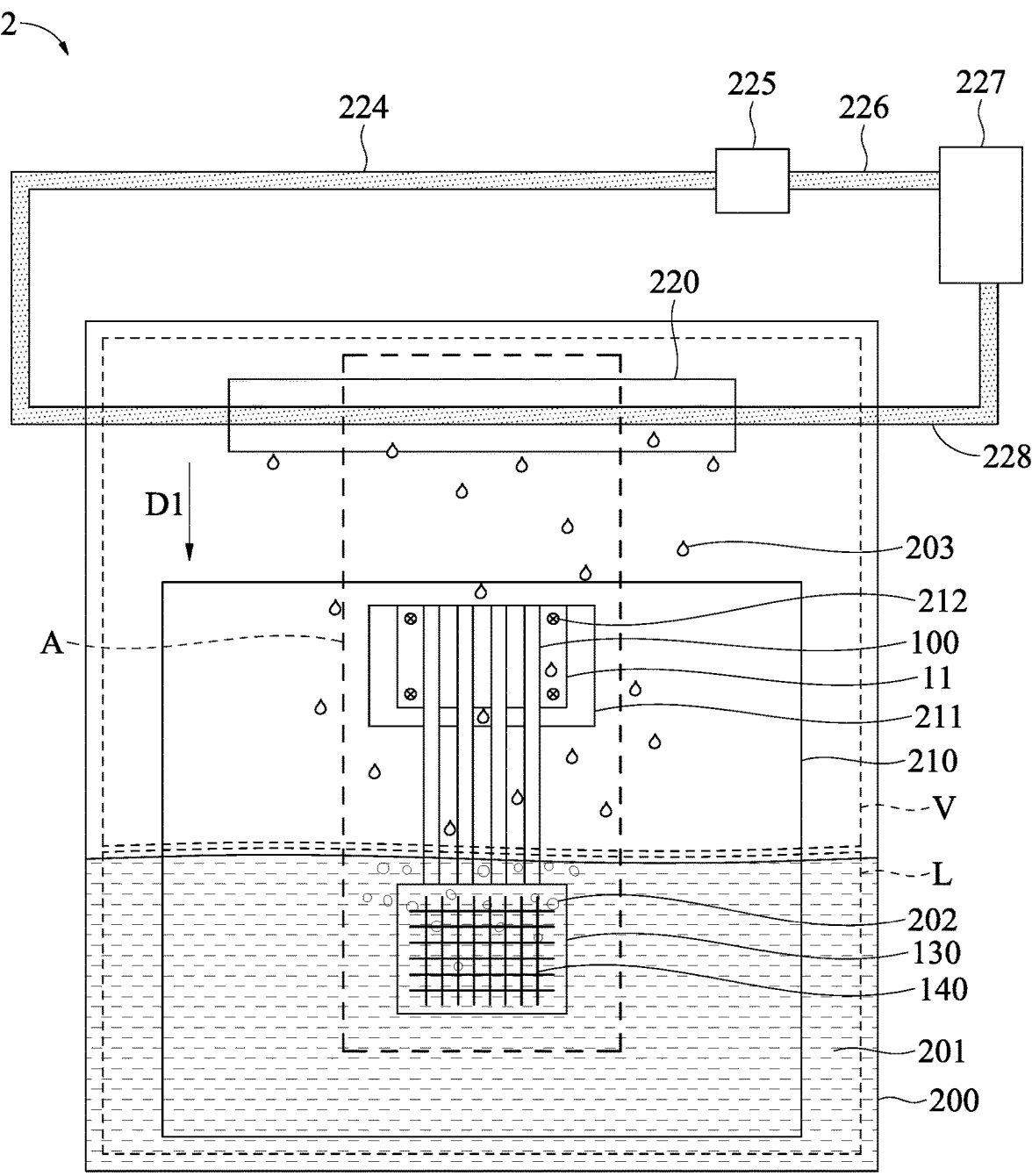
FIG. 1A illustrates a schematic structural view in a first view (i.e., the YZ plane) of an immersion cooling system according to some embodiments.
Figure 1B:
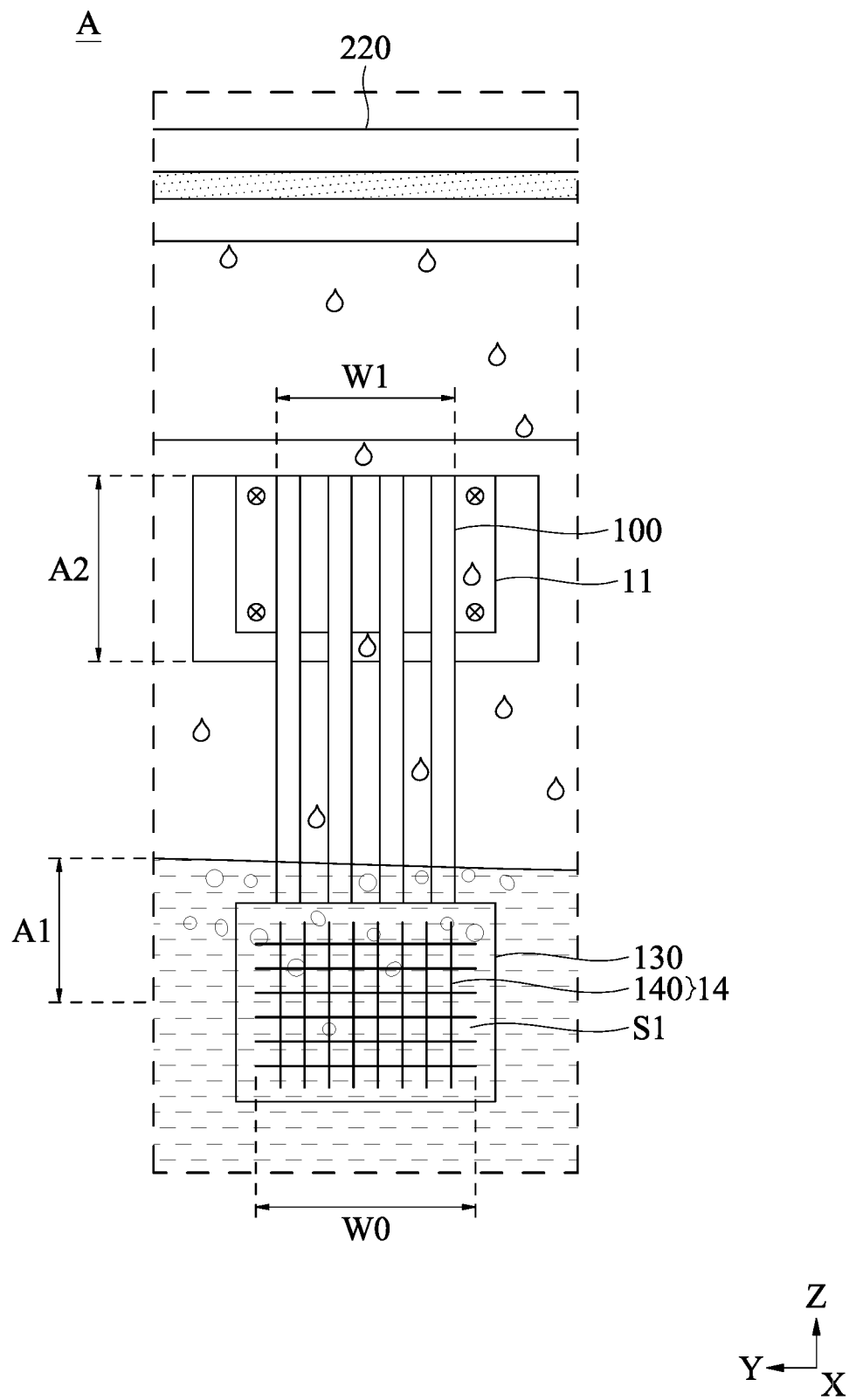
FIG. 1B illustrates a schematic structural view in the first view (i.e., the YZ plane) according to the partial section A of the immersion cooling system shown in FIG. 1A.
Figure 1C:
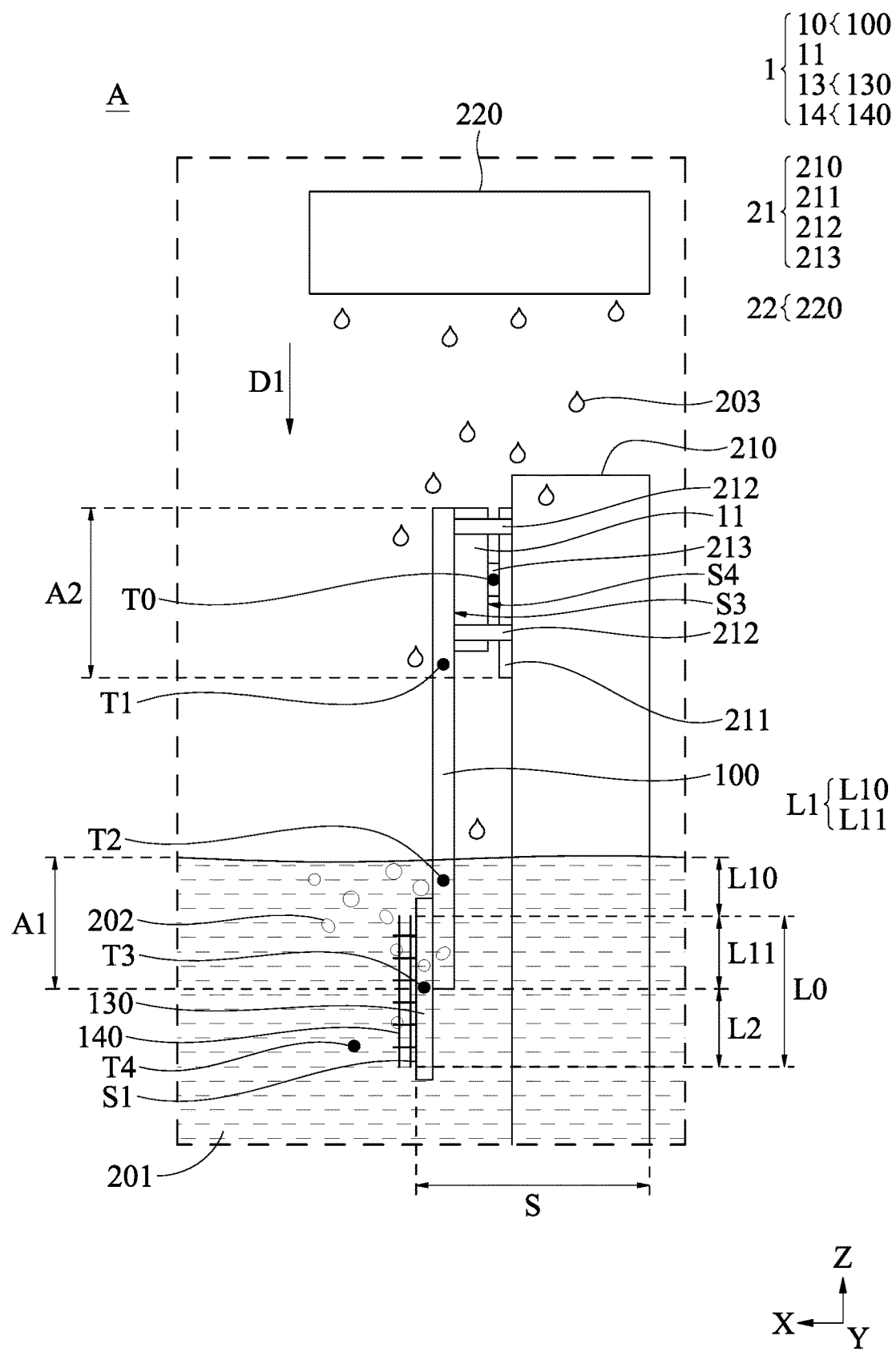
FIG. 1C illustrates a schematic structural view in a second view (i.e., the XZ plane) according to the partial section A of the immersion cooling system shown in FIG. 1A.

Please refer to FIG. 1A and FIG. 1C. FIG. 1A illustrates a schematic structural view in a first view (i.e., the YZ plane) of an immersion cooling system 2 according to some embodiments, and FIG. 1C illustrates a schematic structural view in a second view (i.e., the XZ plane) according to the partial section A of the immersion cooling system 2 shown in FIG. 1A. In FIG. 1A, an immersion cooling system 2 comprises a work tank 20, a device to be cooled 21, and a heat conduction device 1. The work tank 20 has a work tank body 200, and the work tank body 200 has a liquid-phase section L and a vapor section V. The liquid-phase section L is adapted to contain a liquid-phase working fluid 201, and the liquid-phase working fluid 201 has a fluid temperature T4 (shown in FIG. 1C, which will be described later). The vapor section V is adapted to contain a gas-phase heat transfer fluid. The device to be cooled 21 is in the work tank body 200, and at least one portion of the device to be cooled 21 (e.g., a heat source 213 of the device to be cooled 21 shown in FIG. 1C, which will be described later) is in the vapor section V. In other words, in some embodiments, the device to be cooled 21 is completely or partially in the vapor section V, while the other portions of the device to be cooled 21 that are not in the vapor section V (e.g., a portion of a holding seat 210, which will be described later) are in the liquid-phase section L, for example. The at least one portion of the device to be cooled 21 has a device temperature T0 (shown in FIG. 1C), and the device temperature T0 (e.g., between 40° C. and 100° C.; e.g., 100° C.) is substantially greater than the fluid temperature T4 (e.g., between 40° C. and 60° C.; e.g., 60° C.). In some embodiments, a temperature difference is between the device temperature T0 and the fluid temperature T4, and the temperature difference may be, but not limited to, between 5° C. and 40° C., between 5° C. and 35° C., between 5° C. and 30° C., between 5° C. and 25° C., between 5° C. and 20° C., between 5° C. and 15° C., between 5° C. and 10° C., between 5° C. and 8° C., between 3° C. and 5° C., between 1° C. and 5° C., or between 1° C. and 3° C.

In some embodiments, the heat conduction device 1 comprises a heat conduction element 10 and a boiling-assisting structure 14. The heat conduction element 10 may be any material with thermal conductive function, which may be metal, alloy, or a combination thereof.

For example, please still refer to FIG. 1A and FIG. 1C. The heat conduction element 10 has a first section A1 and a second section A2 (shown in FIG. 1C), and the first section A1 is away from the second section A2. The first section A1 and the second section A2 may respectively be partial sections of the heat conduction element 10. For example, the heat conduction element 10 has a first end and a second end opposite to each other, and the first section A1 may be the first end of the heat conduction element 10 (e.g., a lower end of the heat conduction element 10 shown in FIG. 1C), while the second section A2 may be the second end of the heat conduction element 10 (e.g., an upper end of the heat conduction element 10 shown in FIG. 1C). The first section A1 of the heat conduction element 10 is in the liquid-phase section L (shown in FIG. 1A). Hence, the first section A1 of the heat conduction element 10 may conduct heat exchange with the liquid-phase working fluid 201 in the liquid-phase section L.

The liquid-phase working fluid 201 (or referred to as the liquid-phase heat transfer fluid) is a non-conductive fluid. Under normal circumstances (e.g., at a temperature less than the boiling point of the working fluid), the working fluid is a liquid (i.e., the liquid-phase working fluid 201), and the boiling point of the working fluid is less than or substantially equal to the temperature of the first section A1 of the heat conduction element 10. The boiling point of the working fluid may be, but not limited to, between 40° C. and 70° C., between 40° C. and 65° C., between 40° C. and 60° C., or between 40° C. and 55° C. In some embodiments, the boiling point of the working fluid may be less than 40° C. Therefore, when the first section A1 of the heat conduction element 10 (or a portion of the first section A1) is immersed in the liquid-phase working fluid 201, the liquid-phase working fluid 201 may absorb the heat from the first section A1 of the heat conduction element 10 and thus the temperature of the liquid-phase working fluid 201 can reach a critical boiling point thereof rapidly, so that the liquid-phase working fluid 201 is further evaporated as a gas-phase working fluid to further generate bubbles 202.

In FIG. 1A and FIG. 1C, the second section A2 of the heat conduction element 10 is connected to the at least one portion of the device to be cooled 21 (i.e., a portion of the device to be cooled 21 in the vapor section V, such as the heat source 213 shown in FIG. 1C, which will be described later). Hence, the second section A2 of the heat conduction element 10 may conduct heat exchange with the at least one portion of the device to be cooled 21. Once a thermal equilibrium is reached, the temperature of the second section A2 of the heat conduction element 10 may approach the device temperature T0 of the at least one portion of the device to be cooled 21. Because the device temperature T0 is greater than the fluid temperature T4, the heat of the at least one portion of the device to be cooled 21 can be guided from the vapor section V to the liquid-phase section L having a lower temperature through the heat conduction element 10, so that the at least one portion of the device to be cooled 21 can dissipate effectively and rapidly. Accordingly, in some embodiments, even though the at least one portion of the device to be cooled 21 is in the vapor section V and thus cannot contact the liquid-phase working fluid 201 directly, the at least one portion of the device to be cooled 21 can still dissipate effectively and rapidly. Therefore, according to some embodiments, the original work performance and service life of the at least one portion of the device to be cooled 21 can be prevented from being affected and further reduced.

Please still refer to FIG. 1A and FIG. 1C. In some embodiments, the device to be cooled 21 comprises a substrate 211, a heat source 213 (shown in FIG. 1C), and a fixing element 212. The substrate 211 may be a plate or a board made of any material, and the plate of the board may be, but not limited to, a printed circuit board (PCB). The heat source 213 is permanently or detachably on the substrate 211. The heat source 213 may be any device with cooling or dissipation requirements, which may be, but not limited to, chip(s) and component(s) of the chip(s). The fixing element 212 has a first end and a second end opposite to each other, wherein the first end is connected to (e.g., directly contact) the substrate 211, and the second end is connected to (e.g., directly contact) the heat conduction element 10 (or the second end is connected to a heat-conduction-assisting element 11 that is connected to the heat conduction element 10, which will be described later) to connect (e.g., directly contact) the heat conduction element 10 (or the heat-conduction-assisting element 11) to the heat source 213. The fixing element 212 may be any element or component having function of fixing, which may be, but not limited to, a bolt, a screw, a spring screw, or a pin (and a nut, a gasket, or a washer thereof). Therefore, according to some embodiments, through the arrangement of the fixing element 212, the heat source 213 can be stably arranged between the substrate 211 and the heat conduction element 10 (or the heat-conduction-assisting element 11). Hence, according to some embodiments, the heat transfer performance between the heat source 213 and the substrate 211 and/or the heat conduction element 10 (or the heat-conduction-assisting element 11) can be enhanced.

Please refer to FIG. 1C. In some embodiments, the heat conduction device 1 further comprises a heat-conduction-assisting element 11. The heat-conduction-assisting element 11 has two sides opposite to each other, such as the first side S3 and the second side S4 shown in FIG. 1C. The first side S3 of the heat-conduction-assisting element 11 is connected to (e.g., through the fixing element 212 and fixed to) the second section A2 of the heat conduction element 10 (e.g., the second section A2 of the heat conduction pipe 100, which will be described later), and the second side S4 of the heat-conduction-assisting element 11 is connected to (e.g., through the fixing element 212 and directly covers) the device to be cooled 21 (e.g., the at least one portion of the device to be cooled 21, such as the heat source 213). The material of the heat-conduction-assisting element 11 may be any material with thermal conductive function, which may be metal, alloy, or a combination thereof; for example, the heat-conduction-assisting element 11 may be a copper plate or a copper sheet. Therefore, according to some embodiments, through the arrangement of the heat-conduction-assisting element 11, the heat transfer performance between the at least one portion of the device to be cooled 21 (e.g., the heat source 213) and the heat conduction element 10 can be enhanced.

Please still refer to FIG. 1C. In some embodiments, the device to be cooled 21 further comprises one or more holding seats 210, and one or more substrates 211 may be respectively on each of the one or more holding seats 210. The substrate(s) 211 is permanently or detachably fixed to (e.g., through the fixing element 212) the holding seats 210, so that the heat source 213 can be stably arranged among the holding seat 210, the substrate 211, and the heat conduction element 10 (or the heat-conduction-assisting element 11). The holding seat(s) 210 may be chassis, rack(s), or cabinet(s), where the cabinet may be formed by a plurality of the chassis and/or a plurality of the racks. For example, in FIG. 1C, the device to be cooled 21 comprises one holding seat 210, the holding seat 210 is a rack, and thus the immersion cooling system 2 may serve as a rack-mounted server system, for example.

Figure 5:
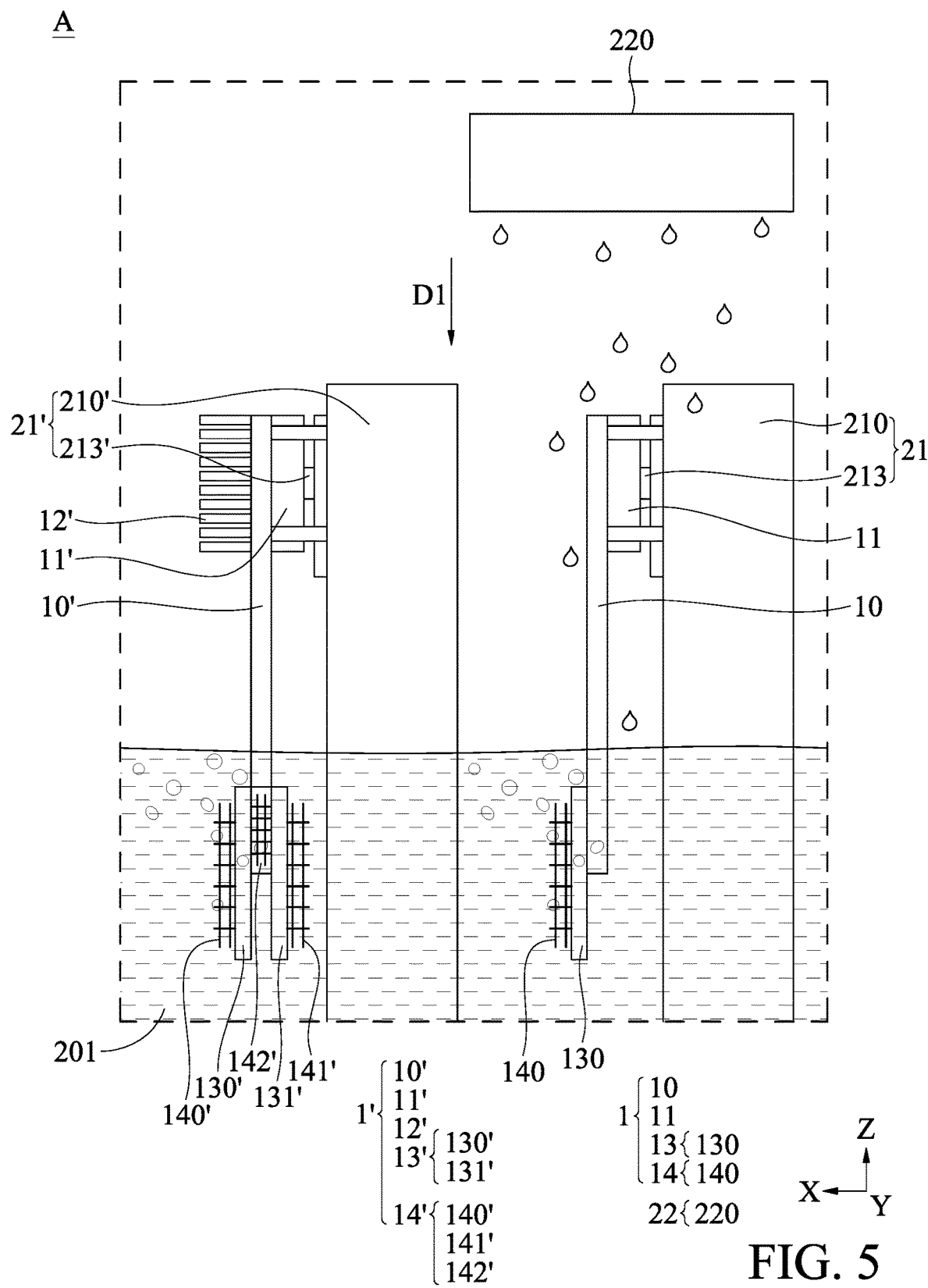
FIG. 5 illustrates a schematic structural view in the second view (i.e., the XZ plane) of an immersion cooling system according to some embodiments.

Alternatively, please refer to FIG. 5. FIG. 5 illustrates a schematic structural view in the second view (i.e., the XZ plane) of an immersion cooling system 2 according to some embodiments. In FIG. 5, the immersion cooling system 2 further comprises a plurality of devices to be cooled 21, 21', and each of the devices to be cooled 21, 21' may be arranged with reference to the aforementioned embodiments of the device to be cooled 21, which are thus not further described in detail herein. Moreover, the device to be cooled 21 may further comprise one or more holding seats 210, the device to be cooled 21' may further comprise one or more holding seats 201', and the holding seats 210, 210' may respectively be racks, for example. Therefore, in some embodiments, the immersion cooling system 2 may serve as a cabinet-mounted server system containing a plurality of the racks (i.e., the holding seats 210, 210').

Moreover, in FIG. 1C and FIG. 5, each of the devices to be cooled 21, 21' may have a thickness S (e.g., the thickness along the X direction shown in FIG. 1C). The thickness S of each of the devices to be cooled 21, 21' may be identical or different from each other; for example, the thickness S may be 48.26 cm (i.e., 19 inch). The thickness S of each of the devices to be cooled 21, 21' may be adjusted according to different specifications of the component(s) (e.g., a server) to be contained in the devices to be cooled 21, 21'; for example, the thickness S may be a multiple of 4.445 cm; that is, the thickness S may be, but not limited to, 1 U (i.e., 4.445 cm), 2 U (i.e., 2*4.445 cm; 8.89 cm), 3 U (i.e., 3*4.445 cm; 13.335 cm), or 4 U (i.e., 4*4.445 cm; 17.78 cm). Therefore, corresponding to the needs of different specifications of the component(s) to be contained in the devices to be cooled 21, 21', the work tank 20 can be further arranged with a system-level device (e.g., a server) with various thickness S, or a system-assembly-level device (e.g., a server assembly) with various thickness S.

Some embodiments of the heat conduction element 10 are further described as below.

Figure 2:
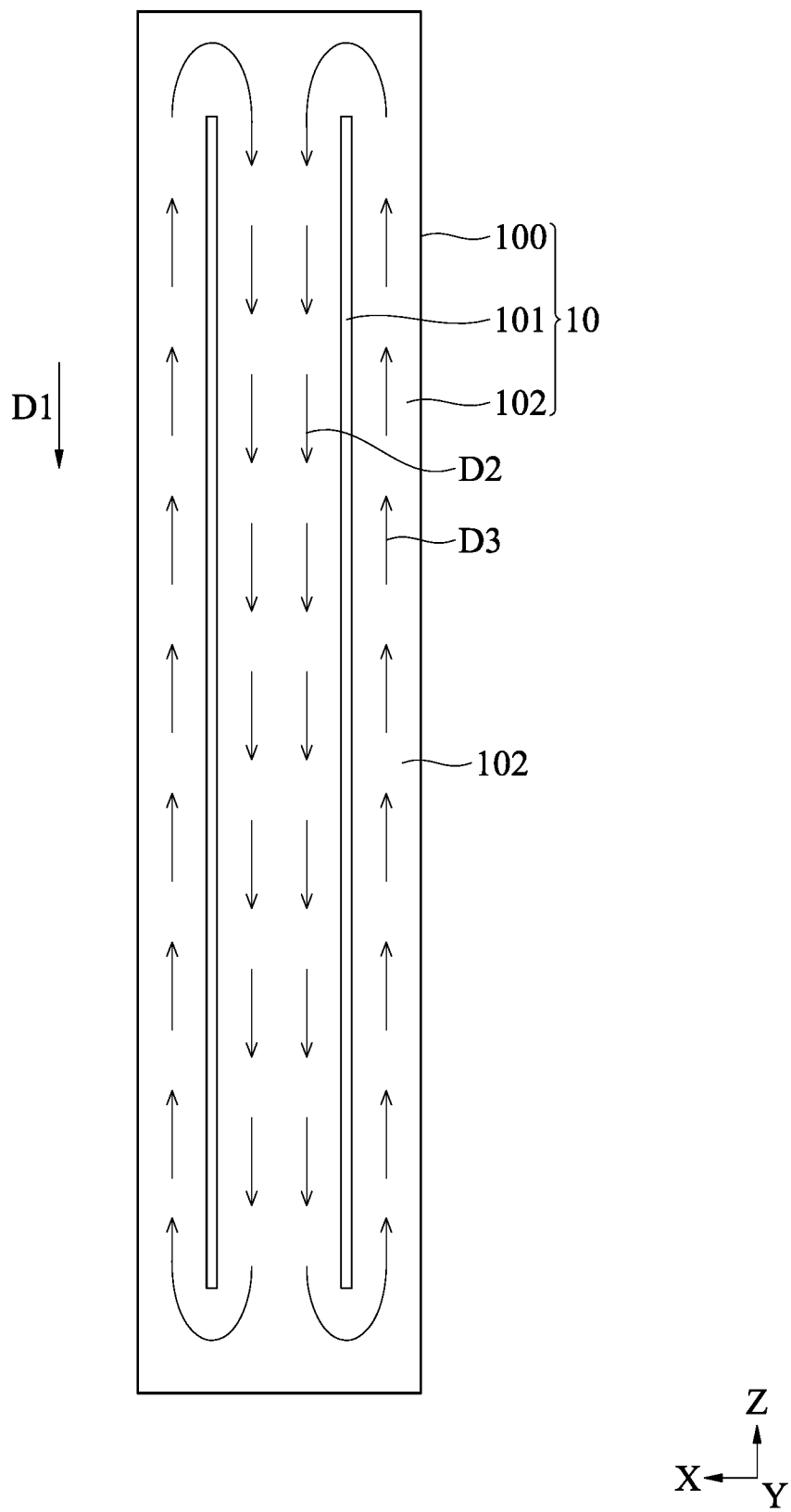
FIG. 2 illustrates a schematic structural view of the interior of a heat conduction pipe according to some embodiments.

In some embodiments, the heat conduction element 10 comprises one or more heat conduction pipes 100. Please refer to FIG. 1A, FIG. 1C, and FIG. 2. FIG. 2 illustrates a schematic structural view of the interior of a heat conduction pipe 100 according to some embodiments. In FIG. 1A and FIG. 1C, the heat conduction element 10 comprises one or more heat conduction pipes 100. Each of the heat conduction pipes 100 has a first section A1 and a second section A2, and the first section A1 is away from the second section A2. In FIG. 2, each of the heat conduction pipes 100 is adapted to contain a heat conduction fluid 102 (including a liquid-phase conduction fluid and a gas-phase conduction fluid) to allow the heat conduction fluid 102 to flow inside each of the heat conduction pipes 100. The heat conduction fluid 102 may be any liquid-phase and/or gas-phase fluid with thermal conductive function, which may be, but not limited to, water. In some embodiments, each of the heat conduction pipes 100 has one or more heat conduction channels 101. The liquid-phase heat conduction fluid in each of the heat conduction pipes 100 is adapted to be heated, so that the temperature of the liquid-phase heat conduction fluid becomes greater than the boiling point of the liquid-phase heat conduction fluid to further form the gas-phase heat conduction fluid. The heat conduction channels 101 and the channel space formed by the heat conduction channels 101 are adapted to contain and guide the gas-phase heat conduction fluid.

For example, in FIG. 2, the heat conduction pipe(s) 100 may be any heat pipe, and the heat conduction fluid 102 may be contained outside the heat conduction channels 101. Because the top end of the heat conduction pipe(s) 100 (e.g., an upper end shown in FIG. 2) has a top-end temperature T1 and is adjacent to the at least one portion of the device to be cooled 21 (e.g., the heat source 213, shown in FIG. 1C), the top-end temperature T1 of the heat conduction pipe(s) 100 (shown in FIG. 1C; e.g., between 40° C. and 77° C.; e.g., 77° C.) is equal to (that is, substantially equal to or less than) the device temperature T0 (e.g., between 40° C. and 100° C.; e.g., 100° C.). Furthermore, the boiling point of the liquid-phase heat conduction fluid is substantially equal to or less than the device temperature T0. Hence, the liquid-phase heat conduction fluid at the top end of the heat conduction pipe(s) 100 can be evaporated rapidly to further form the gas-phase heat conduction fluid at the top end of the heat conduction pipe(s) 100. The gas-phase heat conduction fluid can flow inside the heat conduction pipe(s) 100, so the heat can be removed from the top end of the heat conduction pipe(s) 100. For example, the gas-phase heat conduction fluid can flow inside the heat conduction channel(s) 101 and the channel space formed by the heat conduction channel(s) 101 along a first direction D2 shown in FIG. 2 (e.g., the gravity direction D1), and then the gas-phase heat conduction fluid and the liquid-phase heat conduction fluid can be collected at the bottom end of the heat conduction pipe(s) 100, so that the gas-phase heat conduction fluid can be further condensed as the liquid-phase heat conduction fluid. The liquid-phase heat conduction fluid at the bottom end of the heat conduction pipe(s) 100 may further flow outside the heat conduction channel(s) 101 along a direction opposite to the first direction D2 (e.g., the second direction D3). Hence, the liquid-phase heat conduction fluid and the gas-phase heat conduction fluid of the heat conduction fluid 102 can be circulated and flow inside the heat conduction pipe(s) 100 continuously, so that the gas-phase heat conduction fluid and the liquid-phase heat conduction fluid at the top end of the heat conduction pipe(s) 100 can be cooled. Accordingly, in some embodiments, through the arrangements of the heat conduction pipe(s) 100 and the heat conduction fluid 102 contained in the heat conduction pipe(s) 100, the heat conduction pipe(s) 100 and the at least one portion of the device to be cooled 21 where the heat conduction pipe(s) 100 is connected can be cooled more effectively and rapidly.

Moreover, please refer again to FIG. 1C. According to some embodiments, the bottom end of the heat conduction pipe(s) 100 (e.g., the lower end shown in FIG. 2) has a bottom-end temperature T2, and the top-end temperature T1 of the heat conduction pipe(s) 100 (which is substantially equal to the temperature of the second section A2 of the heat conduction pipe(s) 100) may be substantially equal to or greater than the bottom-end temperature T2 (which is substantially equal to the temperature of the first section A1 of the heat conduction pipe(s) 100). For example, a temperature difference is between the top-end temperature T1 and the bottom-end temperature T2, and the temperature difference may be, but not limited to, between 0° C. and 5° C., between 0° C. and 4° C., between 0° C. and 3° C., between 0° C. and 2° C., between 0° C. and 1° C., between 1° C. and 3° C., or between 1° C. and 2° C. For example, when the device temperature T0 of the at least one portion of the device to be cooled 21 is between 40° C. and 100° C. (e.g., 100° C.), for example, the top-end temperature T1 may be between 40° C. and 77° C. (e.g., 77° C.), and the bottom-end temperature T2 may be between 40° C. and 75° C. (e.g., 75° C.). According to the aforementioned temperature difference, the heat of the second section A2 of the heat conduction pipe(s) 100 (e.g., the top end of the heat conduction pipe(s) 100) can be indeed delivered to the first section A1 of the heat conduction pipe(s) 100 (e.g., the bottom end of the heat conduction pipe(s) 100).

In addition, in some embodiments, the boiling point of the liquid-phase heat conduction fluid contained in each of the heat conduction pipes 100 can be adjusted by controlling the internal pressure of the heat conduction pipe(s) 100. For example, when the liquid-phase heat conduction fluid is water (with the normal boiling point of the liquid-phase heat conduction fluid (that is, the boiling point under 1 atm) being 100° C.), by decreasing the internal pressure of the heat conduction pipe(s) 100, the boiling point of water can be substantially equal to or less than the device temperature T0 (shown in FIG. 1C) of the at least one portion of the device to be cooled 21 (e.g., the heat source 213 shown in FIG. 1C). By absorbing the heat of the at least one portion of the device to be cooled 21, the liquid-phase heat conduction fluid can be evaporated rapidly under a temperature less than the normal boiling point of the liquid-phase heat conduction fluid (e.g., 70° C.), so that the at least one portion of the device to be cooled 21 where the heat conduction pipe(s) 100 is connected can be cooled rapidly. In other words, in some embodiments, even though the liquid-phase heat conduction fluid remains unchanged, by adjusting the internal pressure of the heat conduction pipe(s) 100 and the corresponding boiling temperature, the at least one portion of the device to be cooled 21 with various device temperatures T0 can also be cooled by the same liquid-phase heat conduction fluid.

Figure 13A:
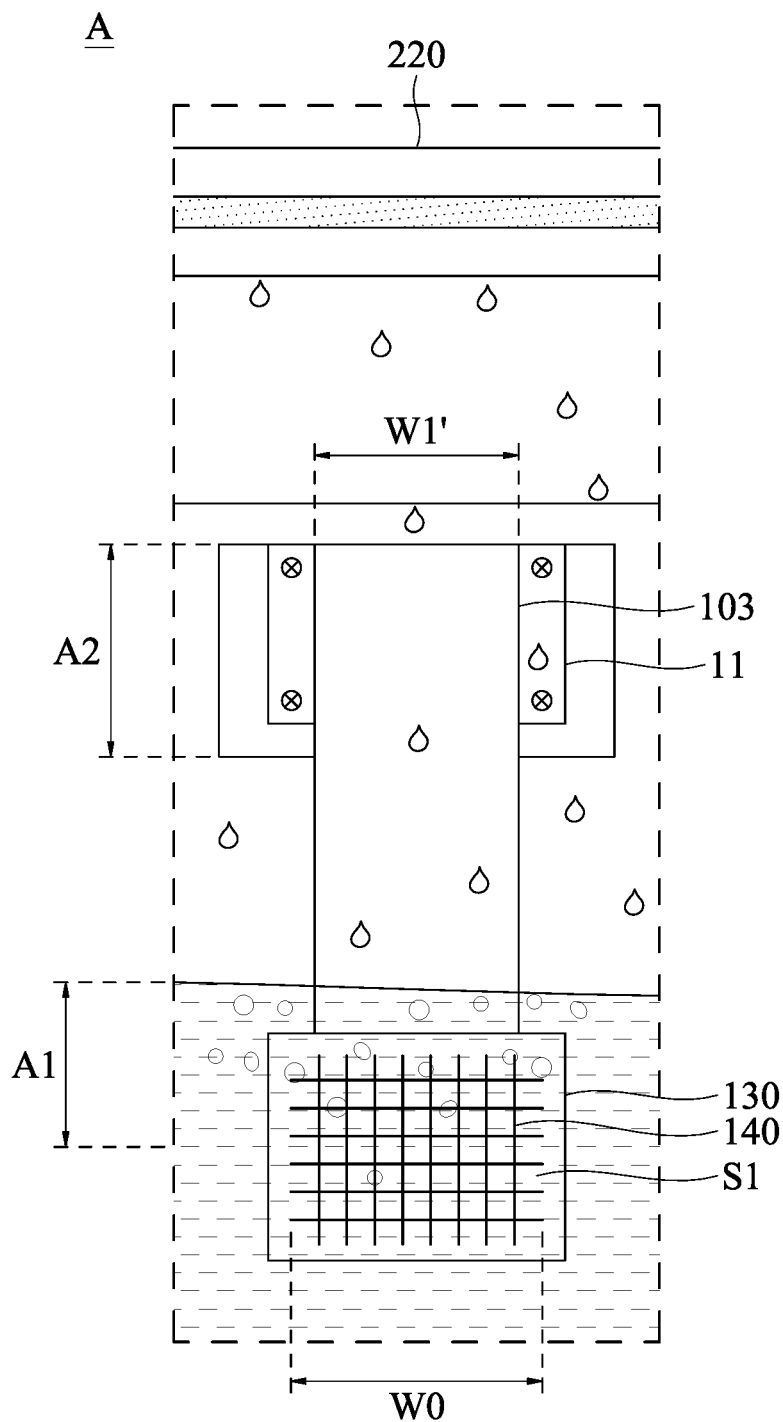
FIG. 13A illustrates a schematic structural view in the first view (i.e., the YZ plane) according to the partial section A of an immersion cooling system according to some embodiments.
Figure 13B:
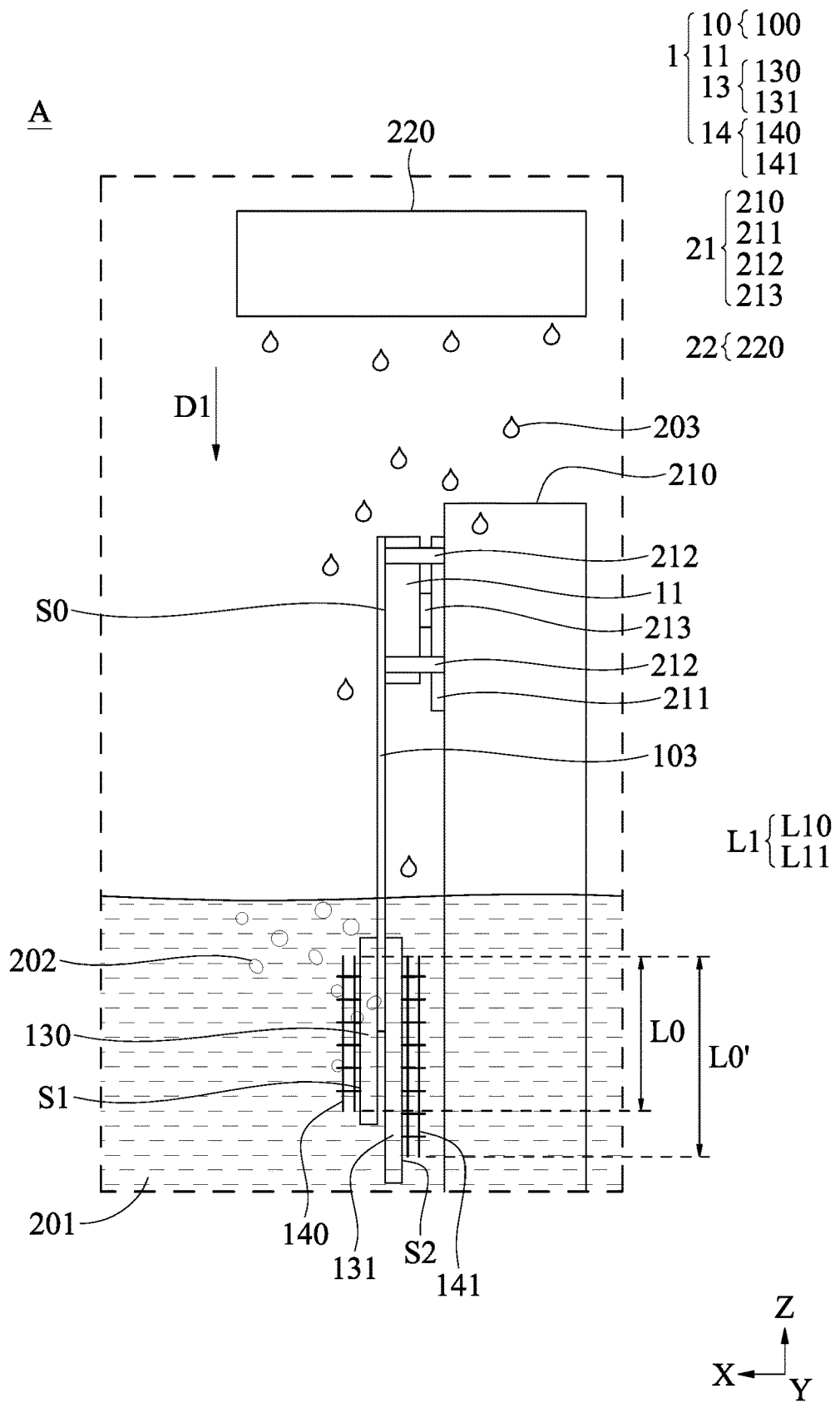
FIG. 13B illustrates a schematic structural view in the second view (i.e., the XZ plane) according to the immersion cooling system shown in FIG. 13A.

In some embodiments, the heat conduction element 10 comprises a heat conduction plate (or referred to as a vapor chamber) 103, or the heat conduction element 10 may comprise one or more heat conduction pipes 100 and a heat conduction plate 103 at the same time. Please refer to FIG. 13A and FIG. 13B, FIG. 13A illustrates a schematic structural view in the first view (i.e., the YZ plane) according to the partial section A of an immersion cooling system 2 according to some embodiments, and FIG. 13B illustrates a schematic structural view in the second view (i.e., the XZ plane) according to the immersion cooling system 2 shown in FIG. 13A. In FIG. 13A and FIG. 13B, the heat conduction element 10 comprises one or more heat conduction plates 103. Each of the heat conduction plates 103 has a first section A1 and a second section A2, and the first section A1 is away from the second section A2. Each of the heat conduction plates 103 has a main surface S0, and the second section A2 of each of the main surfaces S0 thermally contacts (e.g., through the heat-conduction-assisting element 11) the at least one portion of the device to be cooled 21 (i.e., a part of the device to be cooled 21 in the vapor section V, such as the heat source 213 shown in FIG. 13B). Each of the heat conduction plates 103 is adapted to contain a heat conduction fluid 102 (including a liquid-phase conduction fluid and a gas-phase conduction fluid) to allow the heat conduction fluid 102 to flow inside each of the heat conduction plates 103. The interior structures of the heat conduction plate(s) 103 and the heat conduction fluid 102 contained in the heat conduction plate(s) 103 may be referred to the aforementioned embodiments of interior structures of the heat conduction pipe(s) 100 and the heat conduction fluid 102 contained in the heat conduction pipe(s) 100, which are thus not further described in detail herein. Accordingly, in some embodiments, through the arrangements of the heat conduction plate(s) 103 and the heat conduction fluid 102 contained in the heat conduction plate(s) 103, the heat conduction plate(s) 103 and the at least one portion of the device to be cooled 21 where the heat conduction plate(s) 103 is connected can be cooled more effectively and rapidly.

Some embodiments of the boiling-assisting structure 14 are further described as below.

In some embodiments, the boiling-assisting structure 14 is on the first section A1 of the heat conduction element 10. Please refer to FIG. 1C and FIG. 4A to FIG. 4E. FIG. 4A to FIG. 4E respectively illustrate schematic structural views in the second view (i.e., the XZ plane) of an immersion cooling system 2 according to some embodiments. For example, in FIG. 4C, the boiling-assisting structure 14 may surroundingly cover (i.e., surround) the first section A1 or partially cover the first section A1; for example, a third boiling-assisting structure 142 may surroundingly and directly cover the first section A1. Alternatively, in some embodiments shown in FIG. 1C, FIG. 4A, FIG. 4B, FIG. 4D, and FIG. 4E, the boiling-assisting structure 14 may be on the other component(s) that is connected to the first section A1 so as to be on the first section A1; for example, a first boiling-assisting structure 140 and/or a second boiling-assisting structure 141 may be arranged on a first boiler plate 130 and/or a second boiler plate 131. The boiling-assisting structure 14 (e.g., the first boiling-assisting structure 140, the second boiling-assisting structure 141, and the third boiling-assisting structure 142) may be a mesh (shown in FIG. 3A, which will be described later), metal particles (shown in FIG. 3B, which will be described later), a fin (shown in FIG. 3C, which will be described later), or a combination comprising two or three selected from the group consisting of a mesh, metal particles, and a fin. Through the boiling-assisting structure 14 directly or indirectly on the first section A1, when the liquid-phase working fluid 201 flows by the boiling-assisting structure 14, a heterogeneous nucleation will be formed at the interface between the liquid-phase working fluid 201 (which has a liquid-phase surface) and the boiling-assisting structure 14 (which has, for example, a solid-phase surface) to further generate bubbles 202 (i.e., the gas-phase work fluid). The more the bubbles 202 are generated, the more the heats are removed from the liquid-phase working fluid 201, and thus the liquid-phase working fluid 201 can be cooled more properly; therefore, according to some embodiments, the first section A1 of the heat conduction element 10 can also be cooled more effectively.

Figure 3A:
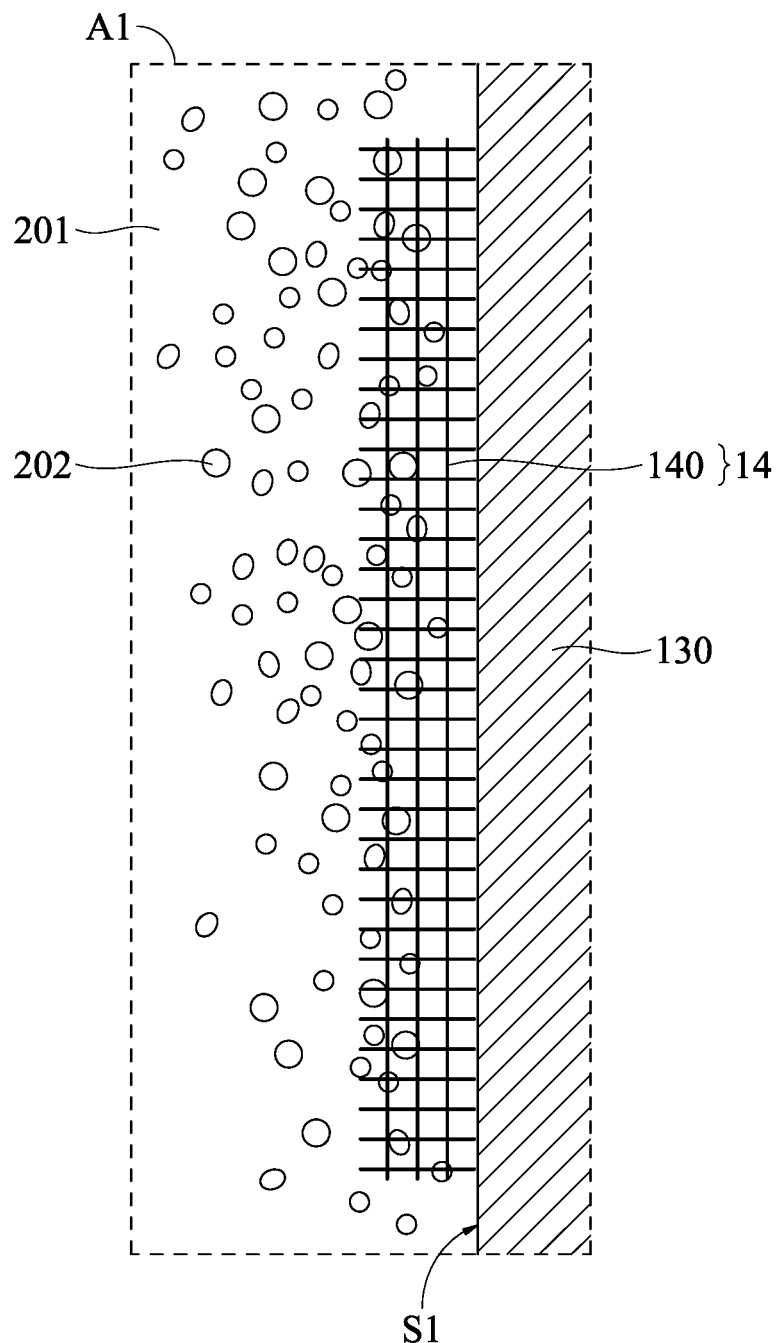
FIG. 3A illustrates a schematic view in the first view (i.e., the YZ plane) of a boiling-assisting structure according to some embodiments.

For example, please refer to FIG. 3A. FIG. 3A illustrates a schematic view in the first view (i.e., the YZ plane) of a boiling-assisting structure 14 according to some embodiments. It should be noted that, only the first boiling-assisting structure 140 is illustrated in FIG. 3A to demonstrate the invention according to some embodiments, which is not intended to limit the invention particularly to this embodiment; instead, a person of ordinary skills in the art would appreciate that other boiling-assisting structures 14 (e.g., the second boiling-assisting structure 141 and the third boiling-assisting structure 142, shown in FIG. 4A and FIG. 4D) may be arranged identically or similarly corresponding to the embodiments of the first boiling-assisting structure 140. The boiling-assisting structure(s) 14 (e.g., the first boiling-assisting structure 140 show in FIG. 3A) may comprise a mesh in one or more layers, which is not limited; for example, the mesh may be in four to five layers. The holes of the mesh and the number of the holes per unit area are not limited and may be arranged according to various demands. The materials of the mesh may be metal, alloy, or a combination thereof, which is not limited herein. Accordingly, in some embodiments, through the arrangement of the mesh, a rougher surface with more cavities and gaps can be formed on the first section A1. Therefore, the heterogeneous nucleation can be formed on the rougher surface with more cavities and gaps by the liquid-phase working fluid 201, which may be beneficial to the heterogeneous nucleation and the formation of more bubbles 202.

Figure 3B:
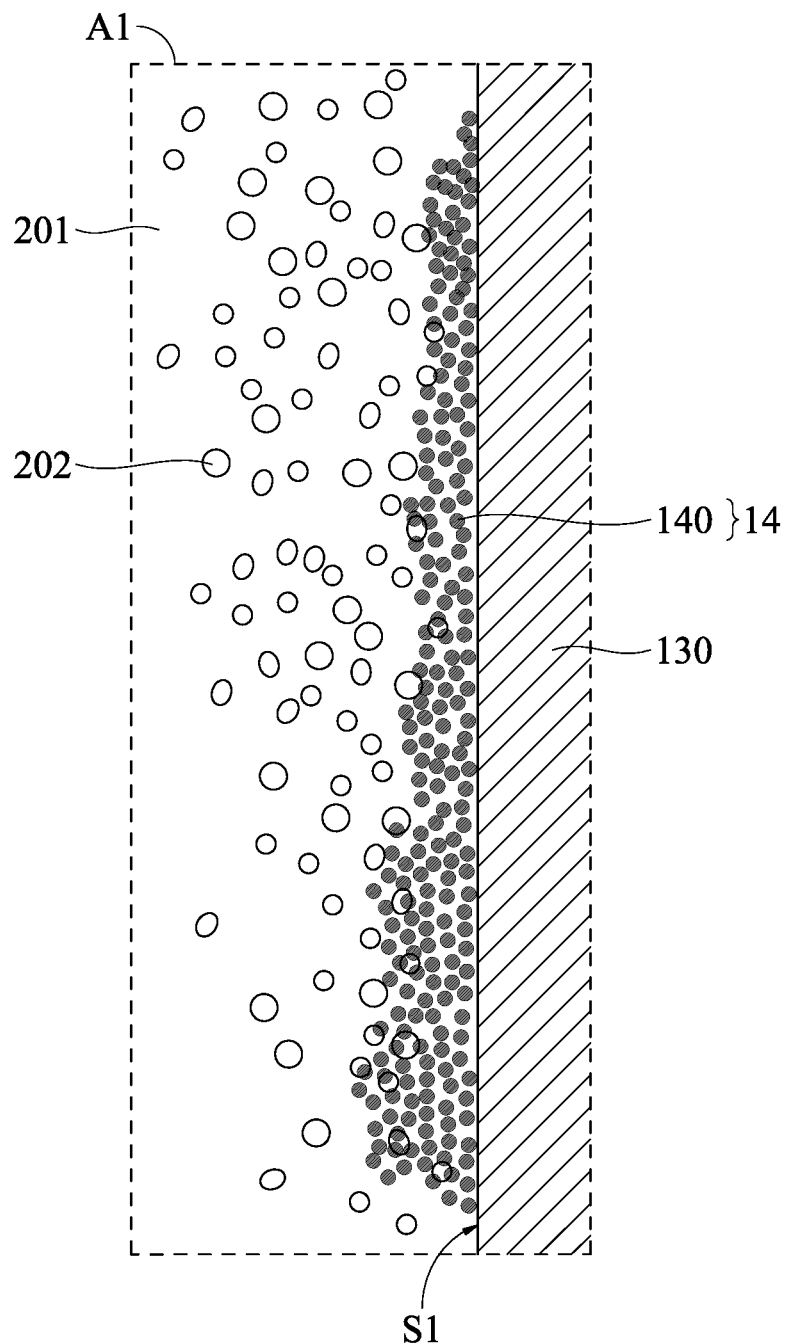
FIG. 3B illustrates a schematic view in the first view (i.e., the YZ plane) of a boiling-assisting structure according to some embodiments.

For another example, please refer to FIG. 3B. FIG. 3B illustrates a schematic view in the first view (i.e., the YZ plane) of a boiling-assisting structure 14 according to some embodiments. It should be noted that, only the first boiling-assisting structure 140 is illustrated in FIG. 3B to demonstrate the invention according to some embodiments, which is not intended to limit the invention particularly to this embodiment; instead, a person of ordinary skills in the art would appreciate that other boiling-assisting structures 14 (e.g., the second boiling-assisting structure 141 and the third boiling-assisting structure 142, shown in FIG. 4A and FIG. 4D) may be arranged identically or similarly corresponding to the embodiments of the first boiling-assisting structure 140. The boiling-assisting structure(s) 14 (e.g., the first boiling-assisting structure 140 show in FIG. 3B) may comprise metal particles. The size and the size distribution of the metal particles are not limited and may be arranged according to various demands. The size of the metal particles may be substantially identical to or different from each other, which is not limited herein. The materials of the metal particles may be metal, alloy, or a combination thereof, which is not limited herein; for example, the material of the metal particles is copper or sintered copper. Accordingly, in some embodiments, through the arrangement of the metal particles, a rougher surface with more cavities and gaps can be formed on the first section A1. Therefore, the heterogeneous nucleation can be formed on the rougher surface with more cavities and gaps by the liquid-phase working fluid 201, which may be beneficial to the heterogeneous nucleation and the formation of more bubbles 202.

Figure 3C:
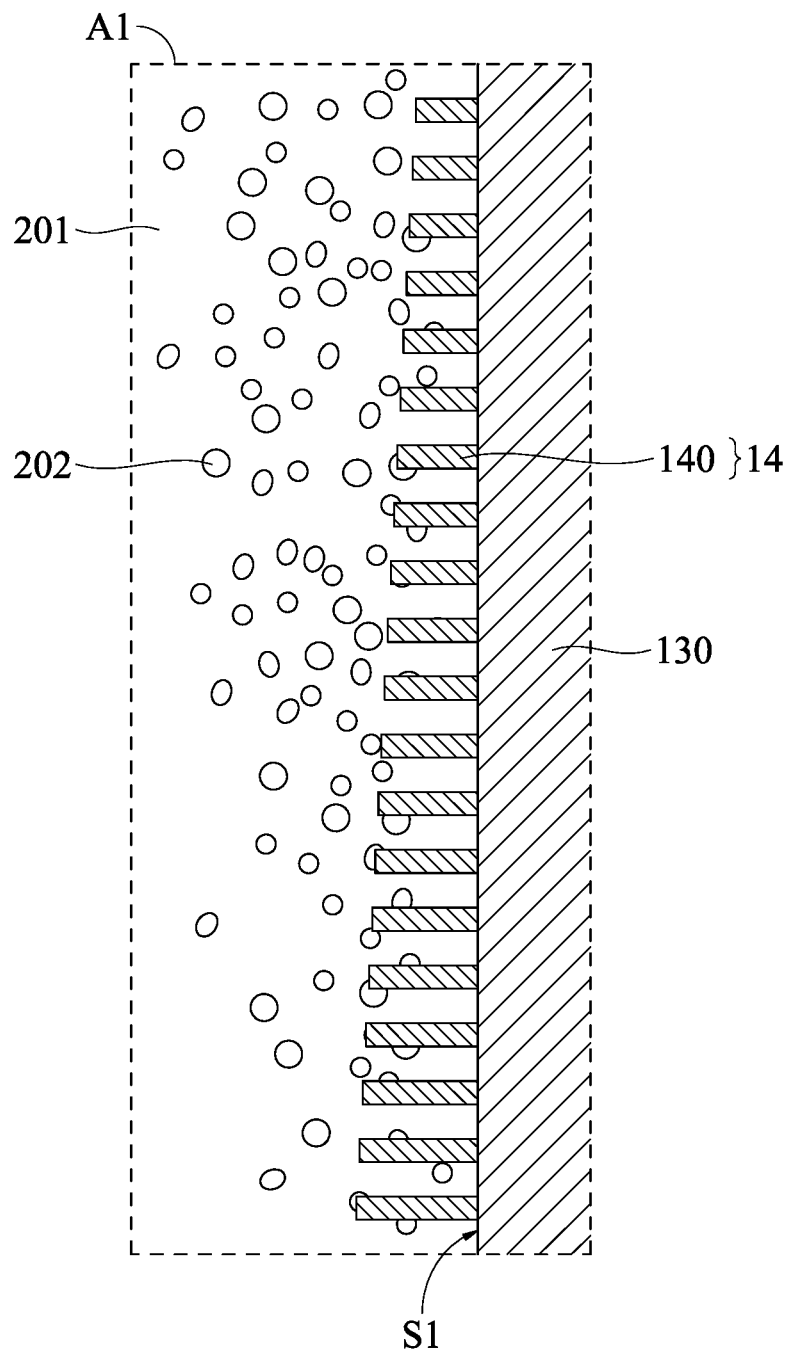
FIG. 3C illustrates a schematic view in the first view (i.e., the YZ plane) of a boiling-assisting structure according to some embodiments.

For another example, please refer to FIG. 3C. FIG. 3C illustrates a schematic view in the first view (i.e., the YZ plane) of a boiling-assisting structure 14 according to some embodiments. It should be noted that, only the first boiling-assisting structure 140 is illustrated in FIG. 3C to demonstrate the invention according to some embodiments, which is not intended to limit the invention particularly to this embodiment; instead, a person of ordinary skills in the art would appreciate that other boiling-assisting structures 14 (e.g., the second boiling-assisting structure 141 and the third boiling-assisting structure 142, shown in FIG. 4A and FIG. 4D) may be arranged identically or similarly corresponding to the embodiments of the first boiling-assisting structure 140. The boiling-assisting structure(s) 14 (e.g., the first boiling-assisting structure 140 show in FIG. 3B) may comprise one or more fins; for example, the fins may be a fin array. The length (e.g., along the Z direction shown in FIG. 3C), the thickness (e.g., along the Y direction shown in FIG. 3C), and the height (e.g., along the X direction shown in FIG. 3C) of each of the fins may be arranged according to various demands, and may respectively be substantially identical to or different from each other, both of which are not limited herein. The pitch between any two of the fins is also not limited herein. The materials of the fins may independently be metal, alloy, or a combination thereof, which is not limited herein. Accordingly, in some embodiments, through the arrangement of the fin(s), a rougher surface with more cavities and gaps can be formed on the first section A1. Therefore, the heterogeneous nucleation can be formed on the rougher surface with more cavities and gaps by the liquid-phase working fluid 201, which may be beneficial to the heterogeneous nucleation and the formation of more bubbles 202.

Please refer again to FIG. 4C. In some embodiments, the boiling-assisting structure 14 is the third boiling-assisting structure 142, and the third boiling-assisting structure 142 surroundingly and directly covers the first section A1. The third boiling-assisting structure 142 has a boiling-assisting structure length L0" along the Z direction shown in FIG. 4C, and the boiling-assisting structure length L0" refers to a distance between the top end and the bottom end of the third boiling-assisting structure 142. The portion of the heat conduction pipe(s) 100 immersed in the liquid-phase working fluid 201 has a heat conduction element length L1 along the Z direction shown in FIG. 4C, and the heat conduction element length L1 is the sum of a first heat conduction element length L10 and a second heat conduction element length L11. Specifically, as shown in FIG. 4C, in some embodiments, the first heat conduction element length L10 refers to a distance between the surface of the liquid-phase working fluid 201 and the top end of the boiling-assisting structure 14 (e.g., the third boiling-assisting structure 142), and the second heat conduction element length L11 refers to a distance between the top end of the boiling-assisting structure 14 (e.g., the third boiling-assisting structure 142) and the bottom end of the first section A1 of the heat conduction element 10 (e.g., the heat conduction pipe(s) 100). In some embodiments, the boiling-assisting structure length L0" is substantially equal to or less than the second heat conduction element length L11. In some embodiments, the boiling-assisting structure length L0" is substantially equal to or greater than the heat conduction element length L1. Accordingly, in some embodiments, through the arrangement of the boiling-assisting structure 14 (e.g., the third boiling-assisting structure 142), the cooling and dissipation performance of the first section A1 of the heat conduction element 10 can be enhanced.

In some embodiments, the immersion cooling system 2 further comprises one boiler plate 13 (e.g., the first boiler plate 130 shown in FIG. 1C, which will be described later) or more than one boiler plate 13 (e.g., the first boiler plate 130 and the second boiler plate 131 shown in FIG. 4A, which will be described later), and each of the boiler plates 13 is respectively on the first section A1 of the heat conduction element 10.

Figure 4A:
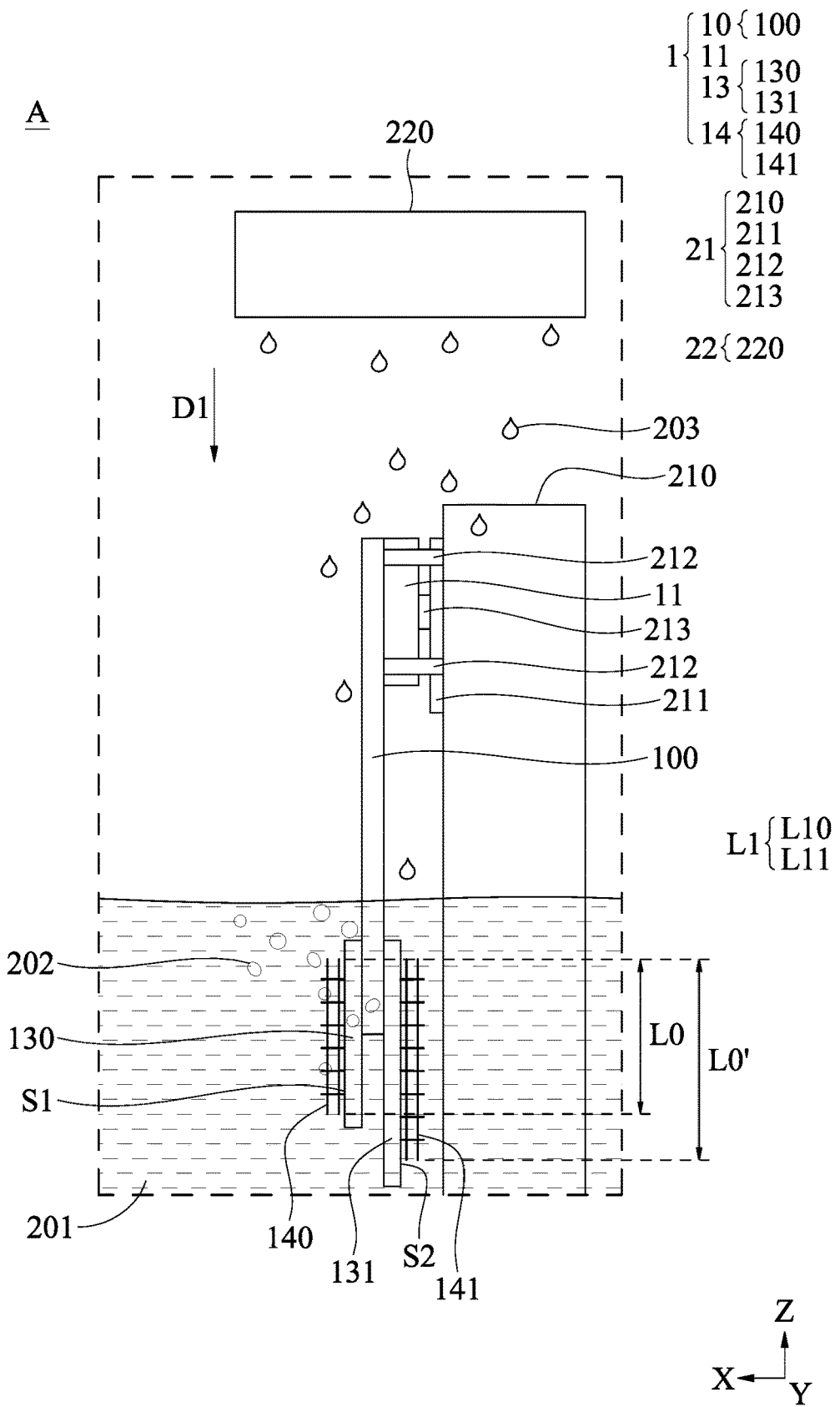
FIG. 4A illustrates a schematic structural view in the second view (i.e., the XZ plane) of an immersion cooling system according to some embodiments.
Figure 4B:
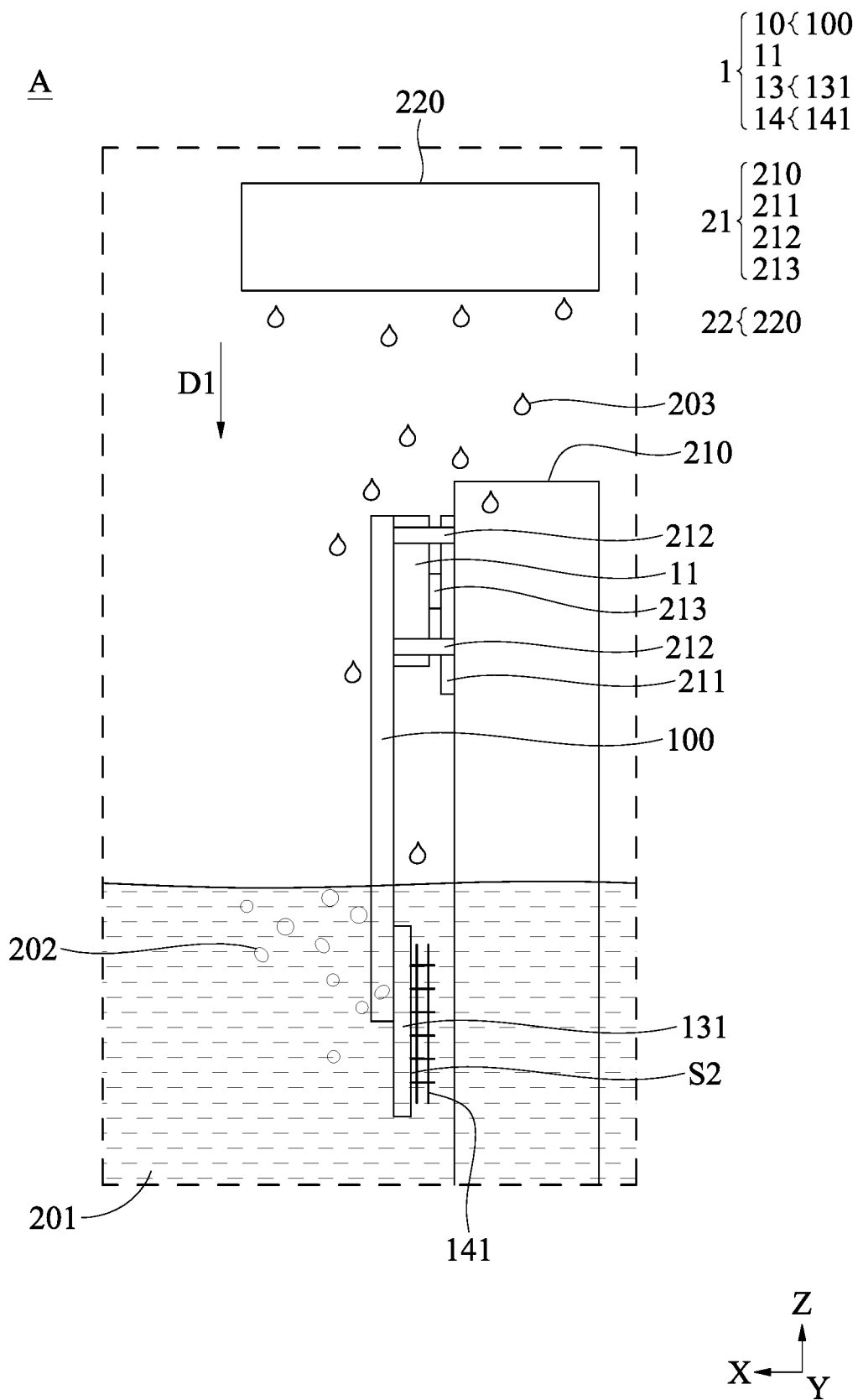
FIG. 4B illustrates a schematic structural view in the second view (i.e., the XZ plane) of an immersion cooling system according to some embodiments.
Figure 4C:
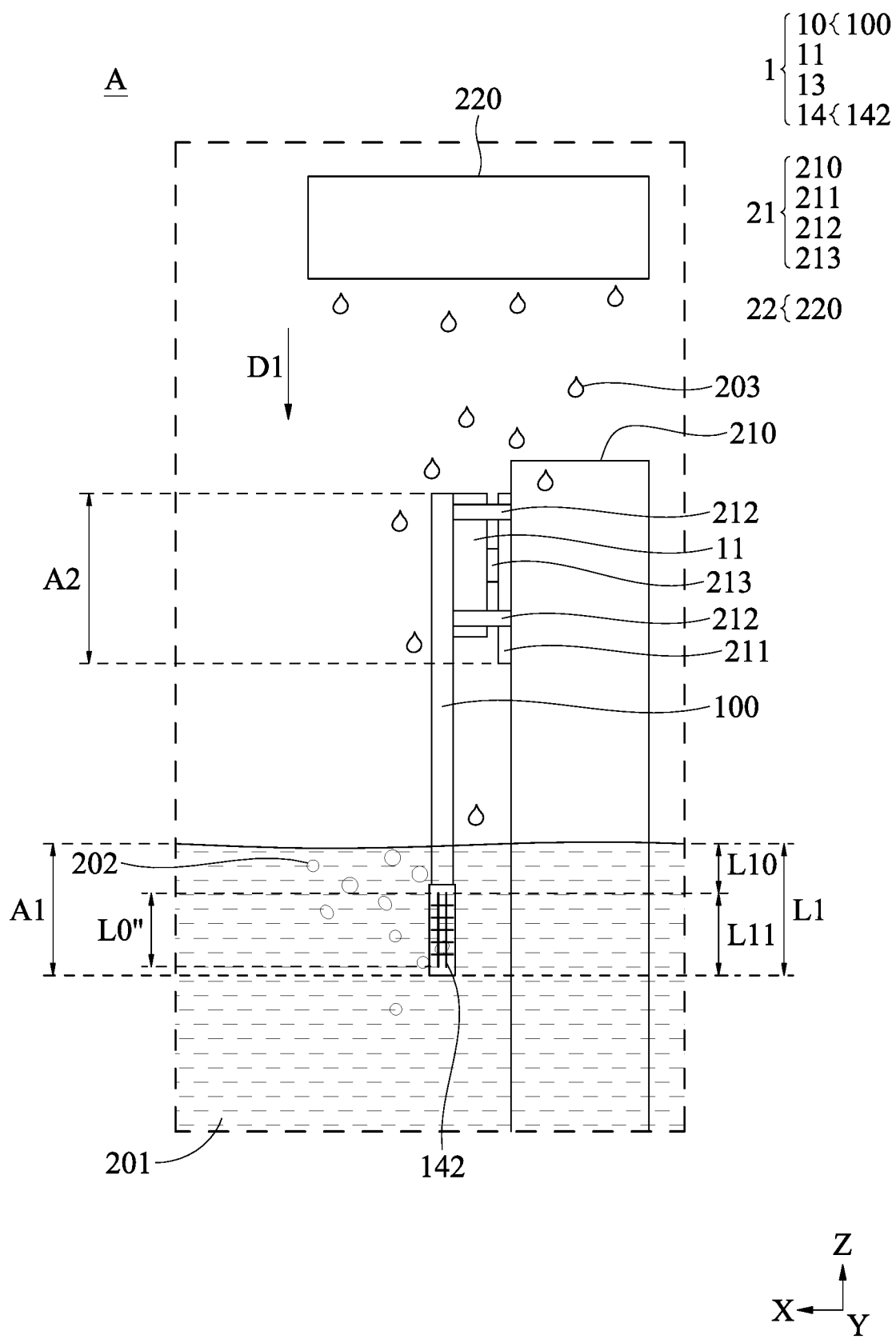
FIG. 4C illustrates a schematic structural view in the second view (i.e., the XZ plane) of an immersion cooling system according to some embodiments.

For example, please refer to FIG. 1A to FIG. 1C and FIG. 4A to FIG. 4E. FIG. 1B illustrates a schematic structural view in the first view (i.e., the YZ plane) according to the partial section A of the immersion cooling system 2 shown in FIG. 1A. The immersion cooling system 2 further comprises one boiler plate 13 (e.g., the first boiler plate 130 shown in FIG. 1A to FIG. 1C, or the second boiler plate 131 shown in FIG. 4B). The boiler plate 13 (e.g., the first boiler plate 130 or the second boiler plate 131) is on the first section A1 of the heat conduction element 10. In FIG. 1A to FIG. 1C, according to some embodiments, the first boiler plate 130 may have a main surface S1 (e.g., the main surface S1 may be a surface of the first boiler plate 130 away from the heat conduction element 10), and the boiling-assisting structure 14 may be the first boiling-assisting structure 140 on the main surface S1. In FIG. 4B, according to some embodiments, the second boiler plate 131 may have a main surface S2 (e.g., the main surface S2 may be a surface of the second boiler plate 131 away from the heat conduction element 10), and the boiling-assisting structure 14 may be the second boiling-assisting structure 141 on the main surface S2. The boiling-assisting structure(s) 14 (e.g., the first boiling-assisting structure 140 or the second boiling-assisting structure 141) may be, but not limited to, a mesh, metal particles, a fin, or a combination comprising two or three selected from the group consisting of a mesh, metal particles, and a fin. The specific embodiments of the boiling-assisting structure 14 may be referred to the aforementioned embodiments, which are thus not further described in detail herein. Hence, according to some embodiments, through various arrangements of the boiling-assisting structure 14, the first section A1 of the heat conduction element 10 can also be cooled effectively.

Please refer again to FIG. 1C. The boiling-assisting structure 14 (e.g., the first boiling-assisting structure 140) has a boiling-assisting structure temperature T3, where the boiling-assisting structure temperature T3 is substantially equal to or less than the bottom-end temperature T2 of the heat conduction element 10, and the boiling-assisting structure temperature T3 is substantially equal to or greater than the fluid temperature T4 of the liquid-phase working fluid 201. In some embodiments, when the device temperature T0 of the at least one portion of the device to be cooled 21 is between 40° C. and 100° C. (e.g., 100° C.), for example, the bottom-end temperature T2 of the heat conduction element 10 may be between 40° C. to 75° C. (e.g., 75° C.), the boiling-assisting structure temperature T3 may be between 40° C. to 70° C. (e.g., 70° C.), and the fluid temperature T4 of the liquid-phase working fluid 201 may be between 40° C. to 60° C. (e.g., 60° C.). According to the aforementioned temperature difference, the heat of the first section A1 of the heat conduction pipe(s) 100 can be indeed delivered to the boiling-assisting structure 14 and further delivered to the liquid-phase working fluid 201, thereby achieving the cooling and dissipation effects.

In some embodiments, the geometric shapes of each of the boiler plates 13 (e.g., the first boiler plate 130 and/or the second boiler plate 131) may be adjusted according to various demands on dissipation or design. For example, in FIG. 1B and FIG. 1C, the first boiler plate 130 extends from the heat conduction element 10 (shown in FIG. 1C) along one or more directions away from the heat conduction element 10 (e.g., the −Z direction and/or the Y direction shown in FIG. 1B); for another example, in FIG. 4B, the second boiler plate 131 may be arranged identically or similarly corresponding to the first boiler plate 130, which is not further described in detail herein. Accordingly, in some embodiments, by optionally expanding the area of the first boiler plate 130 (and/or the second boiler plate 131) along any direction, the first boiling-assisting structure 140 (and/or the second boiling-assisting structure 141) with a much greater area can be arranged on the first boiler plate 130 (and/or the second boiler plate 131). Hence, the cooling and dissipation performance of the heat conduction element 10 may be determined by the surface area of the boiling-assisting structure 14 on the boiler plate 13 (e.g., the first boiling-assisting structure 140 of the first boiler plate 130), and not solely limited by the surface area of the boiling-assisting structure 14 (e.g., the third boiling-assisting structure 142 shown in FIG. 4C) that is directly connected to the heat conduction element 10. Therefore, through the boiler plate 13 and the boiling-assisting structure 14 on the boiler plate 13, the cooling and dissipation performance of the first section A1 of the heat conduction element 10 can be further enhanced.

For example, please refer to FIG. 1B. The first boiling-assisting structure 140 has a boiling-assisting structure width W0 along the Y direction shown in FIG. 1B, the heat conduction element 10 (e.g., the heat conduction pipe(s) 100) as a whole has a heat conduction element width W1 along the Y direction shown in FIG. 1B, and the boiling-assisting structure width W0 is greater than the heat conduction element width W1. For another example, please refer to FIG. 13A. The heat conduction element 10 (e.g., the heat conduction plate 103) as a whole has a heat conduction element width W1' along the Y direction shown in FIG. 13A, and the boiling-assisting structure width W0 is greater than the heat conduction element width W1'. Therefore, according to some embodiments, through the first boiler plate 130 extending from the heat conduction element 10 along a direction (e.g., the Y direction shown in FIG. 1B and FIG. 13A), the cooling and dissipation performance of the first section A1 of the heat conduction element 10 can be further enhanced. Likewise, the second boiler plate 131 may be arranged with reference to the aforementioned embodiments of the first boiler plate 130, which is thus not further described in detail herein. Hence, according to some embodiments, through the second boiler plate 131 extending from the heat conduction element 10, the cooling and dissipation performance of the first section A1 of the heat conduction element 10 can also be further enhanced.

For another example, please refer to FIG. 1C. Taking the first boiler plate 130 shown in FIG. 1C as an example, the first boiling-assisting structure 140 has a boiling-assisting structure length L0 along the Z direction shown in FIG. 1C, where the boiling-assisting structure length L0 is the sum of a extending length L2 (i.e., the length of the boiling-assisting structure 14 (e.g., the first boiling-assisting structure 140) extending from the heat conduction element 10 along the Z direction shown in FIG. 1C) and the second heat conduction element length L11, and the extending length L2 may be substantially equal to or greater than zero. In some embodiments, the boiling-assisting structure length L0 may be substantially equal to or greater than the second heat conduction element length L11. In some embodiments, the boiling-assisting structure length L0 may be substantially equal to or greater than the heat conduction element length L1. Therefore, according to some embodiments, through the first boiler plate 130 further extending from the heat conduction element 10 along another direction (e.g., the Z direction shown in FIG. 1C), the cooling and dissipation performance of the first section A1 of the heat conduction element 10 can be yet further enhanced. Likewise, the second boiler plate 131 may be arranged with reference to the aforementioned embodiments of the first boiler plate 130, which is thus not further described in detail herein. Hence, according to some embodiments, through the second boiler plate 131 extending from the heat conduction element 10, the cooling and dissipation performance of the first section A1 of the heat conduction element 10 can also be further enhanced.

Moreover, please refer to FIG. 1B and FIG. 4A. In some embodiments, the boiling-assisting structure 14 (e.g., the first boiling-assisting structure 140 and the second boiling-assisting structure 141) of each of the boiler plates 13 may have a boiling-assisting structure width W0 (shown in FIG. 1B; and it is noted that W0' is not further denoted) identical to or different from each other, and may also have a boiling-assisting structure length L0 (or L0') (shown in FIG. 4A) identical to or different from each other, which is not limited herein. For example, in FIG. 4A, the first boiling-assisting structure 140 has a boiling-assisting structure length L0, the second boiling-assisting structure 141 has a boiling-assisting structure length L0', and the boiling-assisting structure length L0' of the second boiling-assisting structure 141 is greater than the boiling-assisting structure length L0 of the first boiling-assisting structure 140. In addition, the arrangements of the first boiling-assisting structure 140 (and the first boiler plate 130 thereof) and the second boiling-assisting structure 141 (and the second boiler plate 131 thereof) may be arranged with reference to the aforementioned embodiments of each of the boiling-assisting structures 14 (and the boiler plate 13 thereof), which are thus not further described in detail herein. Therefore, according to some embodiments, through the arrangements of the first boiling-assisting structure 140 (and the first boiler plate 130 thereof) and the second boiling-assisting structure 141 (and the second boiler plate 131 thereof) at the same time, the cooling and dissipation performance of the first section A1 of the heat conduction element 10 (shown in FIG. 1C) can be further enhanced.

Figure 4D:
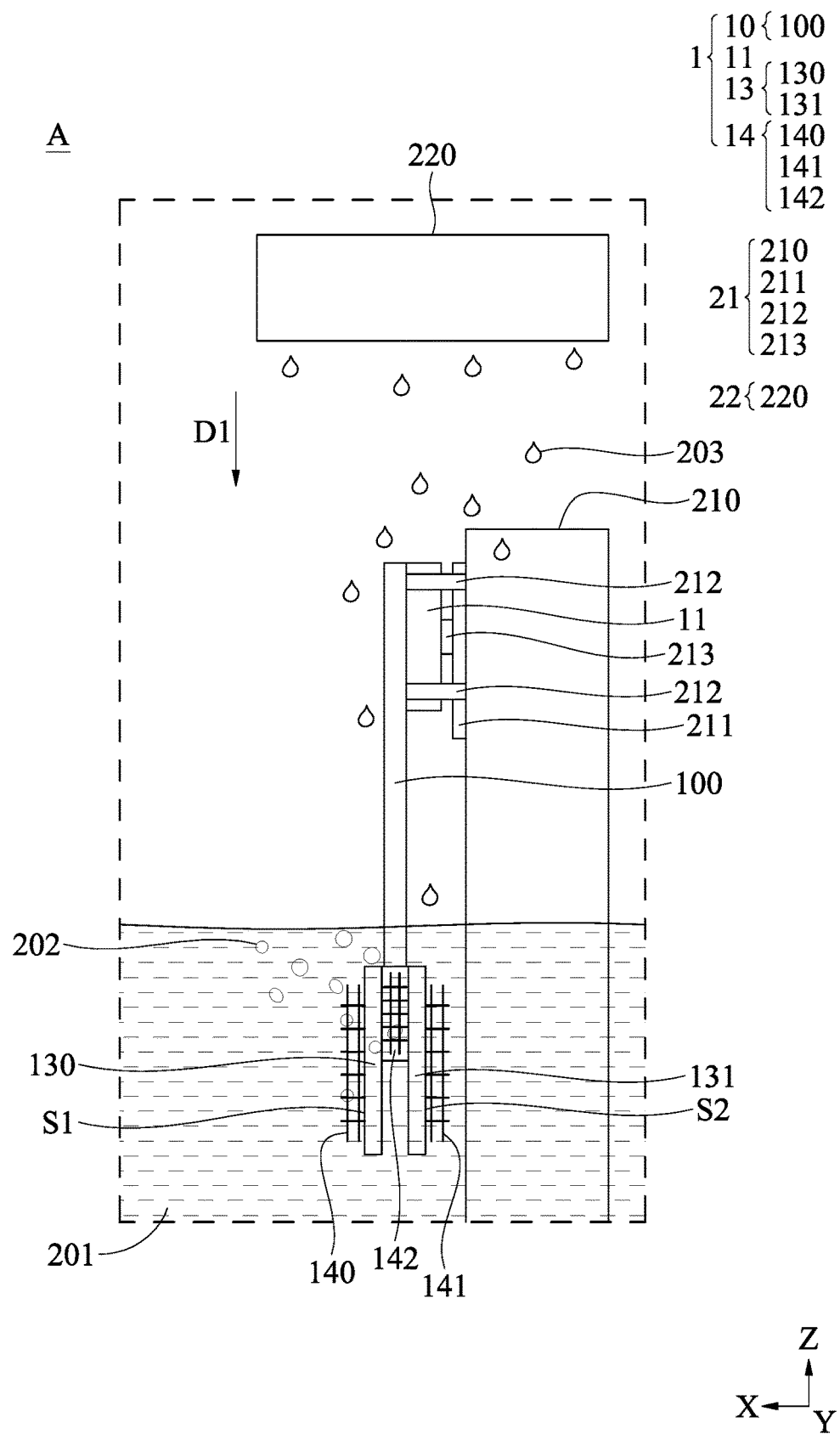
FIG. 4D illustrates a schematic structural view in the second view (i.e., the XZ plane) of an immersion cooling system according to some embodiments.
Figure 4E:
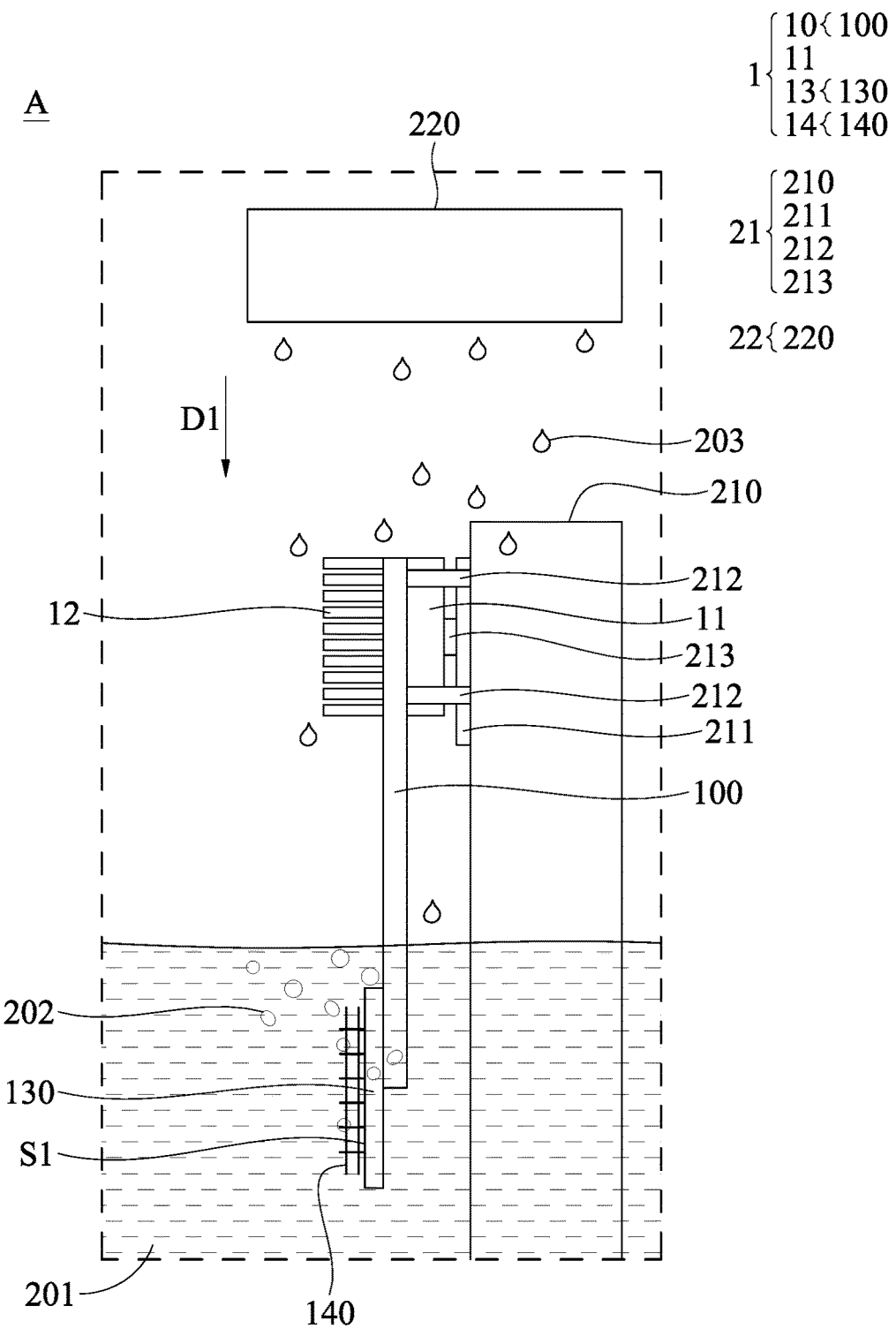
FIG. 4E illustrates a schematic structural view in the second view (i.e., the XZ plane) of an immersion cooling system according to some embodiments.

In some embodiments, please refer to FIG. 4A and FIG. 4D. The immersion cooling system 2 comprises a plurality of boiler plates 13 (e.g., the first boiler plate 130 and the second boiler plate 131 shown in FIG. 4A and FIG. 4D). Each of the boiler plates 13 (e.g., the first boiler plate 130 and the second boiler plate 131) is on the first section A1 of the heat conduction element 10 and opposite to each other. In FIG. 4A, according to some embodiments, the boiling-assisting structures 14 may be the first boiling-assisting structure 140 and the second boiling-assisting structure 141, and the boiling-assisting structure 14 is on both of the first boiler plate 130 and the second boiler plate 131 at the same time; for example, the first boiling-assisting structure 140 is on the main surface S1 of the first boiler plate 130, and the second boiling-assisting structure 141 is on the main surface S2 of the second boiler plate 131. In FIG. 4D, according to some embodiments, the boiling-assisting structures 14 may be the first boiling-assisting structure 140, the second boiling-assisting structure 141, and the third boiling-assisting structure 142. Moreover, a portion of the boiling-assisting structures 14 is on both of the first boiler plate 130 and the second boiler plate 131, and the other portion of the boiling-assisting structures 14 directly covers the first section A1 of the heat conduction element 10. For example, the first boiling-assisting structure 140 is on the main surface S1 of the first boiler plate 130, the second boiling-assisting structure 141 is on the main surface S2 of the second boiler plate 131, and the third boiling-assisting structure 142 directly covers the first section A1 of the heat conduction element 10. Each of the boiling-assisting structures 14 (e.g., the first boiling-assisting structure 140, the second boiling-assisting structure 141, and the third boiling-assisting structure 142) may independently be, but not limited to, a mesh, metal particles, a fin, or a combination comprising two or three selected from the group consisting of a mesh, metal particles, and a fin. The specific embodiments of each of the boiling-assisting structures 14 may be referred to the aforementioned embodiments, which are thus not further described in detail herein.

Please refer again to FIG. 4E. The heat conduction device 1 further comprises one or more heat dissipation elements 12. The heat dissipation elements 12 are independently on a side of the heat conduction element 10 away from the device to be cooled 21. For example, in FIG. 4E, the dissipation elements 12 are on the second section A2 of the heat conduction element 10, and the second section A2 is a side away from the at least one portion of the device to be cooled 21. The heat dissipation element(s) 12 may be any component with thermal conductive function, such as one or more fins. The length (e.g., the size along the Z direction shown in FIG. 4E), the width (e.g., the size along the Y direction shown in FIG. 4E), and the height (e.g., the size along the X direction shown in FIG. 4E) of each of the fins may be arranged according to various demands, and may respectively be substantially identical to or different from each other, both of which are not limited herein. The pitch between any two of the fins is also not limited herein. Moreover, an overall arrangement length of the fins is also not limited herein; for example, in FIG. 4E, the fins are arranged along the Z direction shown in FIG. 4E and have an overall arrangement length substantially equal to the length of the heat-conduction-assisting element 11 along the Z direction shown in FIG. 4E. The materials of the fins may be metal, alloy, or a combination thereof, which is not limited herein. Therefore, according to some embodiments, through the arrangement of the heat dissipation element(s) 12, a greater dissipation area that is exposed to the environment may be provided on the heat conduction element 10, so that the cooling and dissipation performance can be enhanced.

Please refer to FIG. 5. According to some embodiments, the immersion cooling system 2 may comprise a plurality of the devices to be cooled 21, 21'. At least one portion of the device to be cooled 21 corresponds to the heat conduction device 1, and at least one portion of the device to be cooled 21' corresponds to the heat conduction device 1'. The heat conduction device 1 may comprise the heat conduction element 10 and the boiling-assisting structure 14 (and may even comprise one or more selected from the group consisting of the boiler plate 13, the heat-conduction-assisting element 11, and the heat dissipation element 12 (shown in FIG. 4E)); and the heat conduction device 1' may comprise the heat conduction element 10' and the boiling-assisting structure 14' (and may even comprise one or more selected from the group consisting of the boiler plate 13', the heat-conduction-assisting element 11', and the heat dissipation element 12' (shown in FIG. 5)). The embodiments of the heat conduction elements 10, 10', the boiling-assisting structures 14, 14' (e.g., the first boiling-assisting structures 140, 140', the second boiling-assisting structure 141', and the third boiling-assisting structure 142'), the boiler plates 13, 13' (e.g., the first boiler plates 130, 130' and the second boiler plate 131'), the heat-conduction-assisting elements 11, 11', and/or the heat dissipation element 12' may be referred to the aforementioned embodiments, which are thus not further described in detail herein. Therefore, according to some embodiments, the at least one portion of the devices to be cooled 21, 21' in the vapor section V may be cooled more effectively and simultaneously, thereby enhancing the overall cooling and dissipation performance provided by the immersion cooling system 2 in per unit time period.

In some embodiments, the immersion cooling system 2 further comprises a heat exchange device 22 in the vapor section V. For example, please refer to FIG. 1A. The heat exchange device 22 comprises a condenser 220 in the vapor section V (e.g., the condenser 220 is above the surface of the liquid-phase working fluid 201). The condenser 220 may be applied with a cooling fluid (not denoted), and both of the condenser 220 and the cooling fluid of the condenser 220 have a temperature less than the temperature of the gas-phase heat conduction fluid; for example, a temperature less than the dew point or the boiling point of the working fluid. Therefore, when the gas-phase working fluid contacts the condenser 220, a heat exchange between the gas-phase working fluid and the condenser 220 may be conducted. The temperature of the gas-phase working fluid would be then reduced, and the gas-phase working fluid would be condensed into droplets 203 of the liquid-phase working fluid 201 to flow back to the fluid section L and be reused for cooling the at least one portion of the device to be cooled 21 (e.g., the heat source 213 shown in FIG. 1C). Accordingly, in some embodiments, through the reused liquid-phase working fluid 201, the required usage of the liquid-phase working fluid 201 can be prevented from being unnecessarily increased, thereby enhancing the cooling and dissipation performance provided by per unit of the liquid-phase working fluid 201.

Please still refer to FIG. 1A. In some embodiments, the heat exchange device 22 further comprises a condensation pump 225 and a heat exchanger 227. The condensation pump 225 and the heat exchanger 227 are independently inside or outside the work tank 20, which is not limited herein. For example, in FIG. 1A, both of the condensation pump 225 and the heat exchanger 227 are outside the work tank 20, and only the condenser 220 is inside the work tank 20 (e.g., in the vapor section V). The condensation pump 225 may be any device that can increase the pressure of the fluid inside the device, which is not limited herein. A first end of the condensation pump 225 is in communication with a first end of the condenser 220 (for example, through a first condensation pipe 224). A second end of the condensation pump 225 is in communication with a first end of the heat exchanger 227 (for example, through a second condensation pipe 226). A second end of the heat exchanger 227 is in communication with a second end of the condenser 220 (for example, through a third condensation pipe 228). The materials of the first condensation pipe 224, the second condensation pipe 226, and the third condensation pipe 228 may independently comprise at least one selected from the group consisting of metal, alloy, ceramic, plastic, and rubber, which is not limited herein. Accordingly, in some embodiments, through a condensation circulation formed by the condenser 220, the condensation pump 225, and the heat exchanger 227, the condensation fluid from the condenser 220 (with a higher temperature) can be cooled by decreasing the temperature of the condensation fluid to be less than the dew point or the boiling point of the working fluid, so that the cooling fluid is pumped back to the condenser 220 to condense the gas-phase working fluid. Hence, the liquid-phase working fluid 201 in the work tank 20 can be recycled and reused for cooling the at least one portion of the device to be cooled 21 (e.g., the heat source 213 shown in FIG. 1C).

Figure 6:
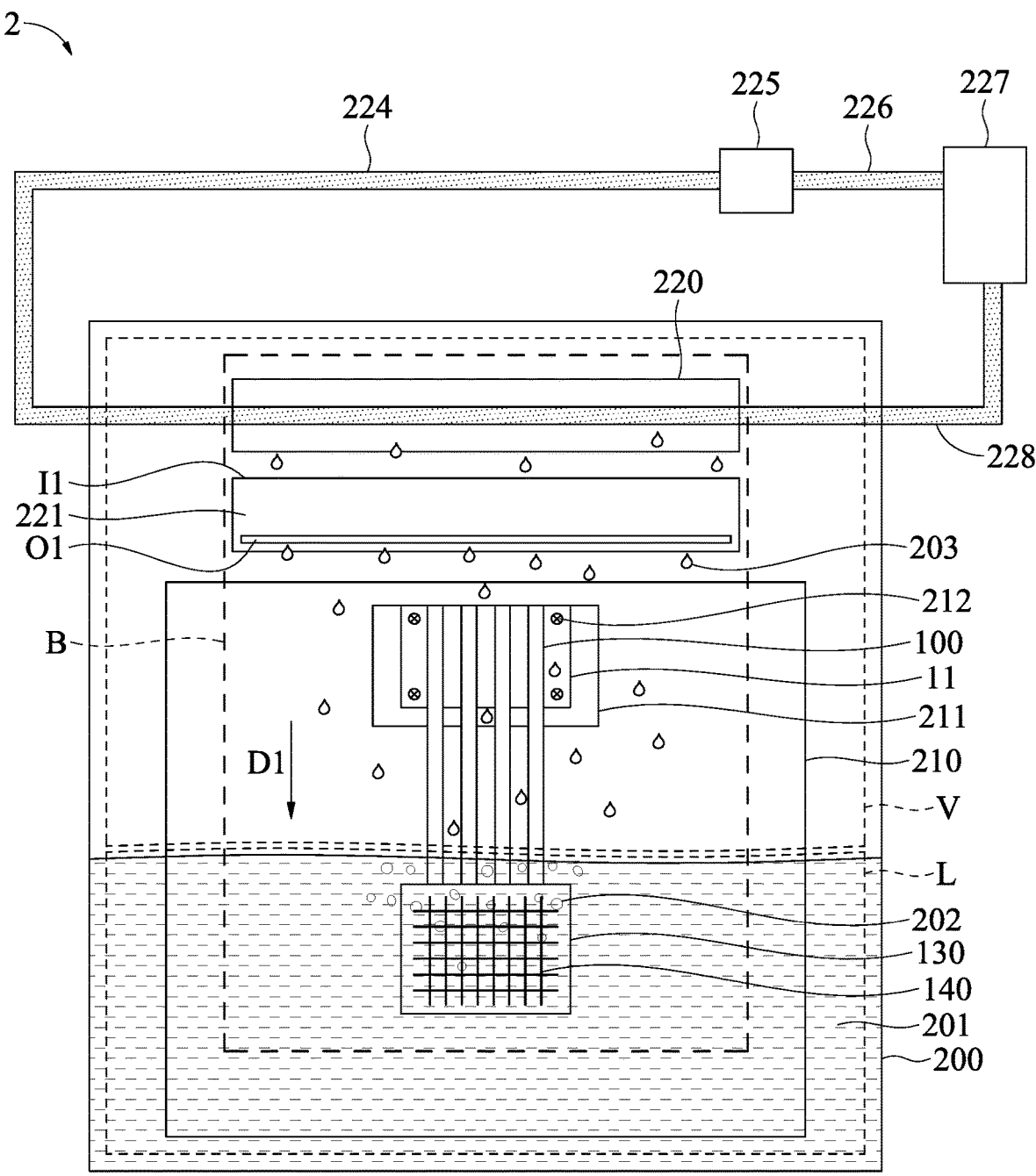
FIG. 6 illustrates a schematic structural view in the first view (i.e., the YZ plane) of an immersion cooling system according to some embodiments.

In some embodiments, the heat exchange device 22 further comprises one fluid-guiding element 221, and the fluid-guiding element 221 is correspondingly adjacent to the condenser 220. Please refer to FIG. 6. FIG. 6 illustrates a schematic structural view in the first view (i.e., the YZ plane) of an immersion cooling system 2 according to some embodiments. In FIG. 6, the fluid-guiding element 221 is between the condenser 220 and the at least one portion of the device to be cooled 21 (e.g., the heat source 213 shown in FIG. 7B, which will be described later) to contain the droplets 203 condensed by the condenser 220. Moreover, through the fluid-guiding element 221, the droplets 203 may be guided to a certain location (which may be, but not limited to, above the at least one portion of the device to be cooled 21). Therefore, according to some embodiments, through guiding the droplets 203 to the proximity of the at least one portion of the device to be cooled 21, the droplets 203 can be applied to cool the at least one portion of the device to be cooled 21 more effectively. Accordingly, the cooling and dissipation performance provided by the liquid-phase working fluid 201 in per unit time period can be thus enhanced.

Figure 7A:
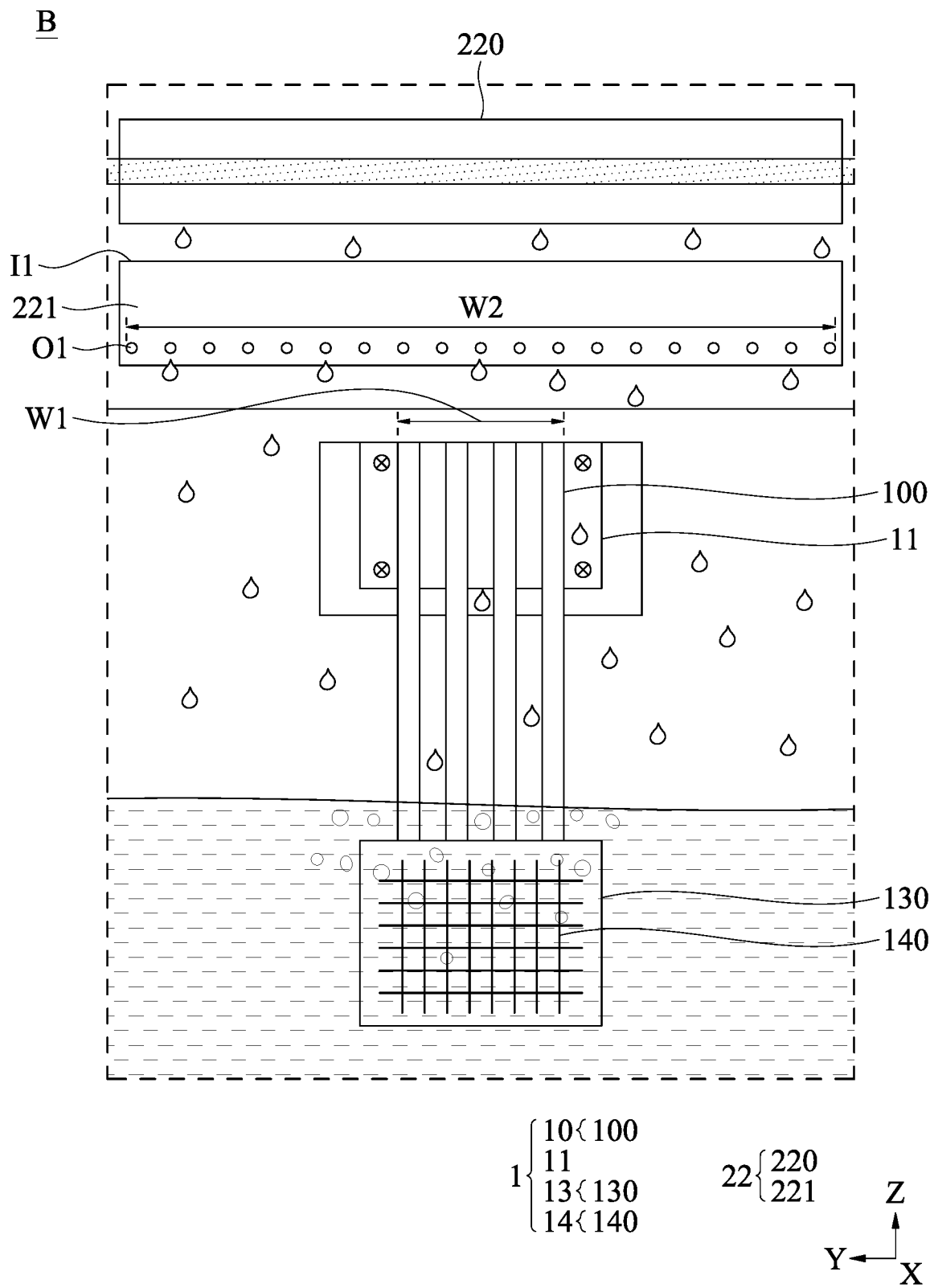
FIG. 7A illustrates a schematic structural view in the first view (i.e., the YZ plane) with respect to the partial section B of the immersion cooling system shown in FIG. 6 according to some embodiments.
Figure 7B:
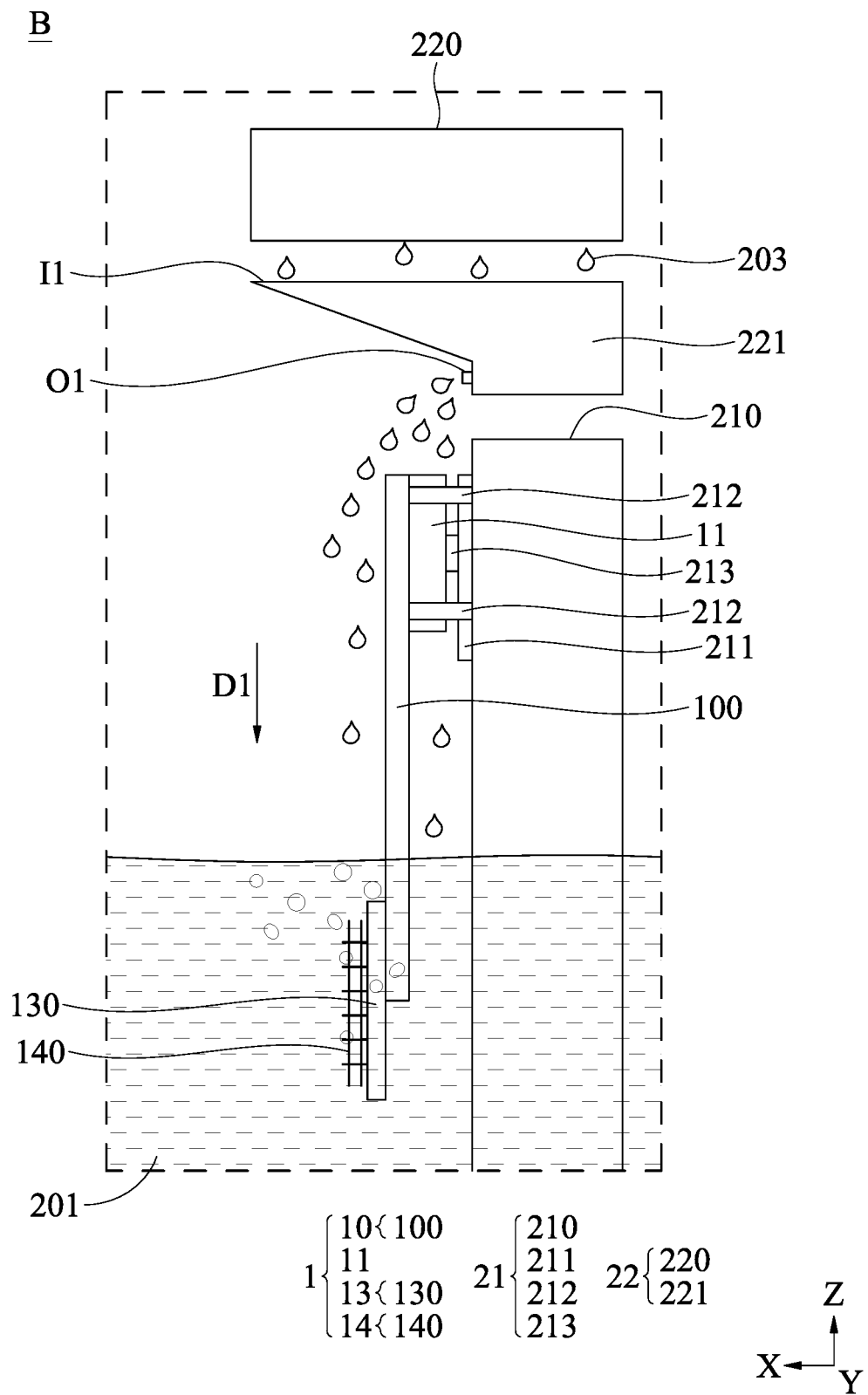
FIG. 7B illustrates a schematic structural view in the second view (i.e., the XZ plane) according to the partial section B of the immersion cooling system shown in FIG. 7A.
Figure 8:
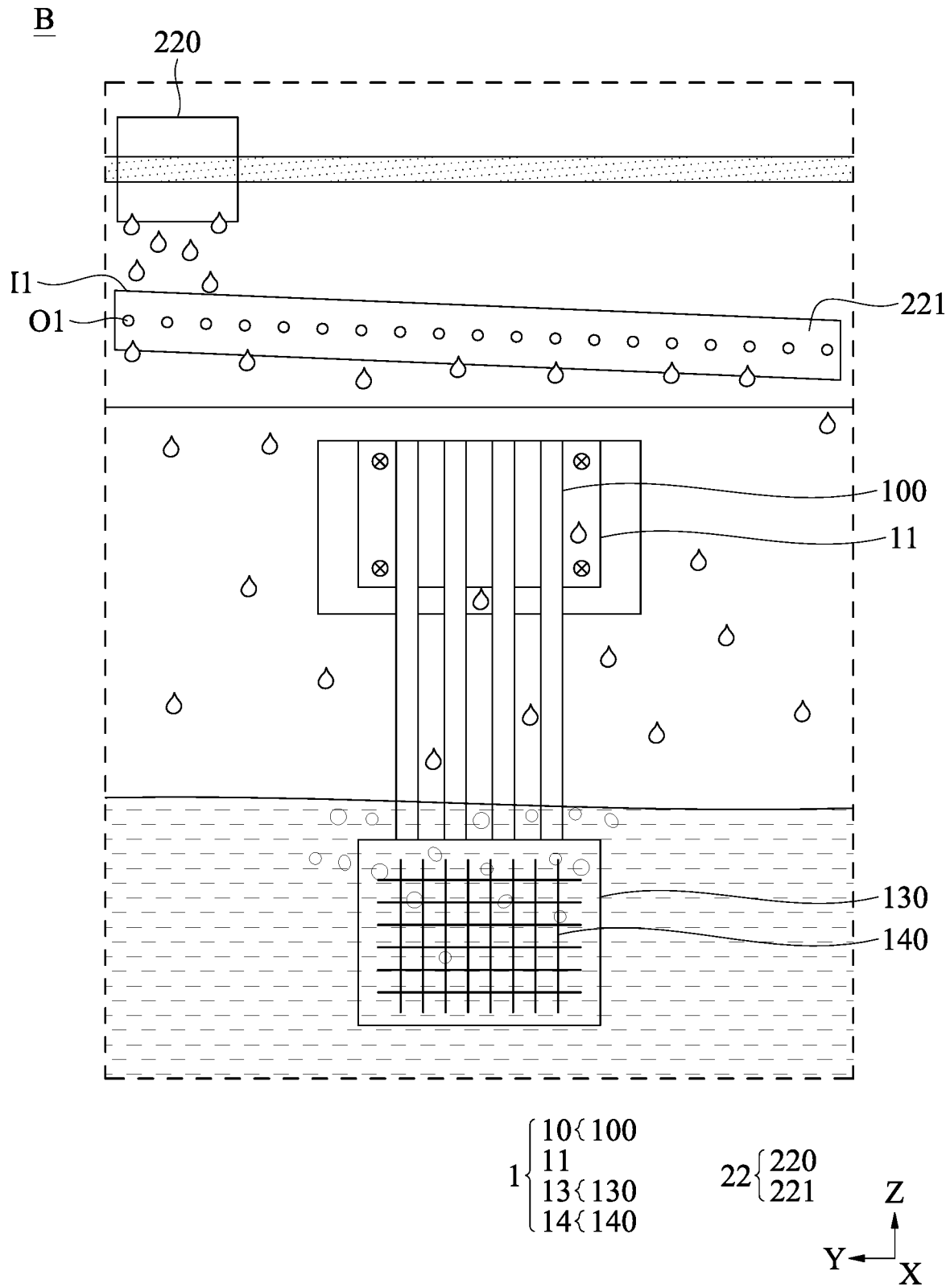
FIG. 8 illustrates a schematic structural view in the first view (i.e., the YZ plane) with respect to the partial section B of the immersion cooling system shown in FIG. 6 according to some embodiments.

For example, please refer to FIG. 6, FIG. 7A, FIG. 7B, and FIG. 8. FIG. 7A and FIG. 8 respectively illustrate schematic structural views in the first view (i.e., the YZ plane) with respect to the partial section B of the immersion cooling system 2 shown in FIG. 6 according to some embodiments; and FIG. 7B illustrates a schematic structural view in the second view (i.e., the XZ plane) according to the partial section B of the immersion cooling system 2 shown in FIG. 7A. In FIG. 6 and FIG. 7A, the fluid-guiding element 221 may have one or more fluid-guiding inlets I1 (e.g., one fluid-guiding inlet I1 shown in FIG. 6, or a plurality of fluid-guiding inlets I1 shown in FIG. 7A) and one or more fluid-guiding outlets O1 (e.g., one fluid-guiding outlet O1 shown in FIG. 6, or a plurality of fluid-guiding outlets O1 shown in FIG. 7A). Each of the fluid-guiding outlets O1 is correspondingly adjacent to the condenser 220 to contain the droplets 203 condensed by the condenser 220. Each of the fluid-guiding outlets O1 is not greater than the corresponding one or more of the fluid-guiding inlets I1 and adjacent to the at least one portion of the device to be cooled 21 (which may be, but not limited to, above the at least one portion of the device to be cooled 21) to guide the droplets 203 to a certain location outside the fluid-guiding element 221. The fluid-guiding inlet(s) I1 and the fluid-guiding outlet(s) O1 may independently be an opening in any shape, such as a long channel opening (e.g., the fluid-guiding outlet O1 shown in FIG. 6), a funnel-shaped channel opening (e.g., the fluid-guiding inlet I1 shown in FIG. 7B), or a circular opening (e.g., the fluid-guiding outlets O1 shown in FIG. 7A and FIG. 7B), which is not limited herein. In some embodiments, a plurality of the fluid-guiding outlets O1 as a whole may be arranged as a fluid-guiding outlet O1 in various shapes, such as inclined fluid-guiding outlets O1 (e.g., the fluid-guiding outlets O1 inclined clockwise as a whole shown in FIG. 8). Hence, according to some embodiments, through the fluid-guiding outlets O1 in various arrangement shapes, various effects of guiding, collecting, and/or dropping of the droplets 203 that flow through the fluid-guiding outlets O1 may be provided. For example, by adjusting the arrangement space density of the fluid-guiding outlets O1, different total dropping amounts of the droplets 203 can be provided. For another example, by adjusting the arrangement height and/or location of the fluid-guiding outlet(s) O1, different dropping height and/or dropping time difference of the droplets 203 can be provided. Accordingly, in some embodiments, demands for various cooling and dissipation performance can be satisfied through the arrangement of the fluid-guiding outlet(s) O1.

Figure 11:
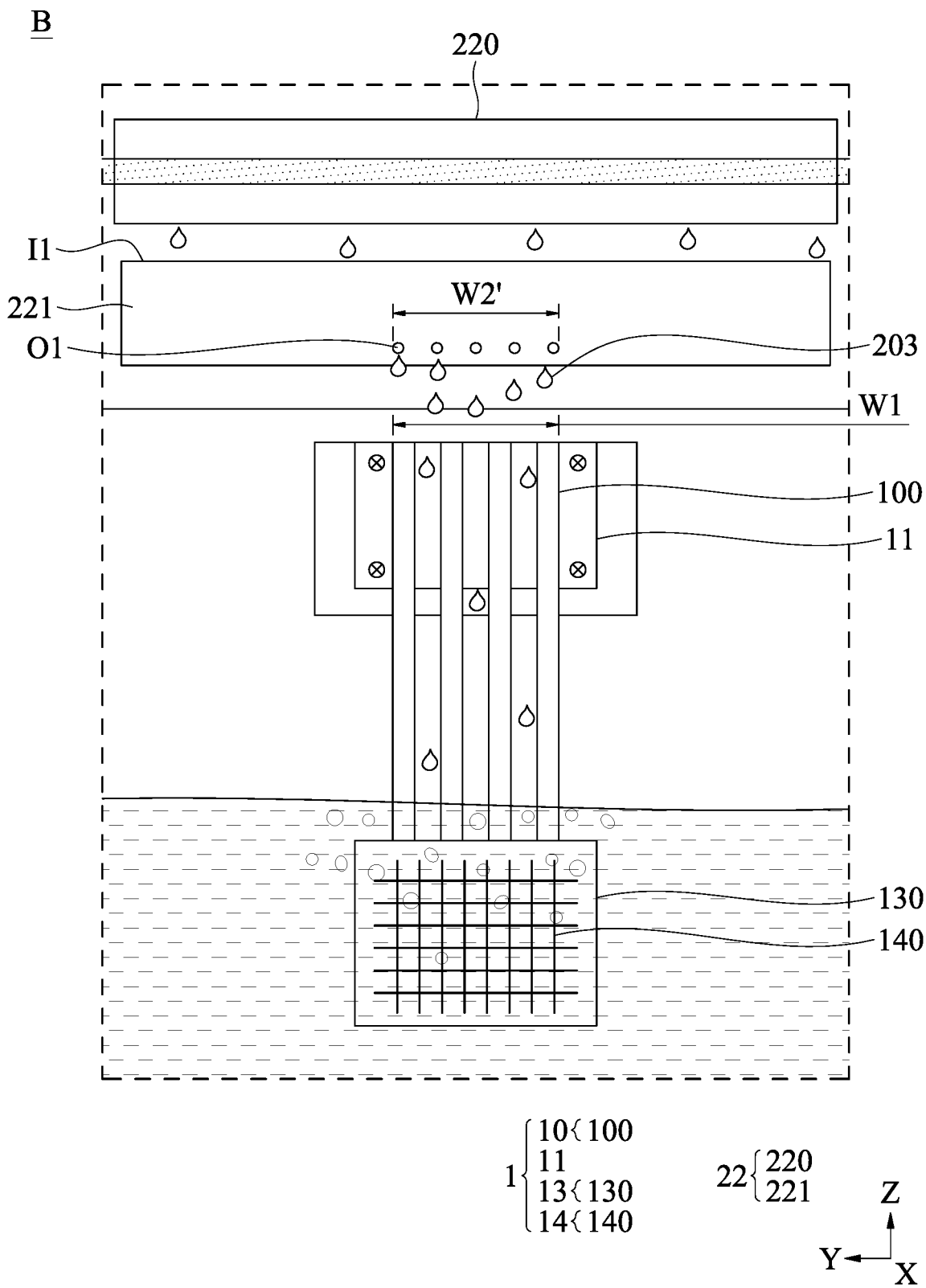
FIG. 11 illustrates a schematic structural view in the first view (i.e., the YZ plane) with respect to the partial section B of the immersion cooling system shown in FIG. 6 according to some embodiments.

For another example, please refer to FIG. 7A and FIG. 11. FIG. 11 illustrates a schematic structural view in the first view (i.e., the YZ plane) with respect to the partial section B of the immersion cooling system 2 shown in FIG. 6 according to some embodiments. In FIG. 7A and FIG. 11, a plurality of fluid-guiding outlets O1 may be correspondingly adjacent to the at least one portion of the device to be cooled 21, the fluid-guiding outlets O1 as a whole may have an outlet width W2 (as shown in FIG. 7A) or an outlet width W2' (as shown in FIG. 11), and the outlet widths W2, W2' are substantially equal to or greater than the heat conduction element width W1 (as shown in FIG. 7A and FIG. 11). For example, in FIG. 7A, the outlet width W2 of the fluid-guiding outlets O1 is greater than the heat conduction element width W1. Therefore, according to some embodiments, the droplets 203 flowing from the fluid-guiding outlets O1 can be applied to cool the heat conduction element 10 and the device to be cooled 21 adjacent to the heat conduction element 10 at the same time. For another example, in FIG. 11, the outlet width W2' of the fluid-guiding outlets O1 is substantially equal to the heat conduction element width W1. Therefore, according to some embodiments, the droplets 203 flowing from the fluid-guiding outlets O1 can be applied to mainly cool the heat conduction element 10. Accordingly, in some embodiments, demands for various cooling and dissipation performance can be satisfied through the arrangements of the fluid-guiding outlet(s) O1.

Figure 9:
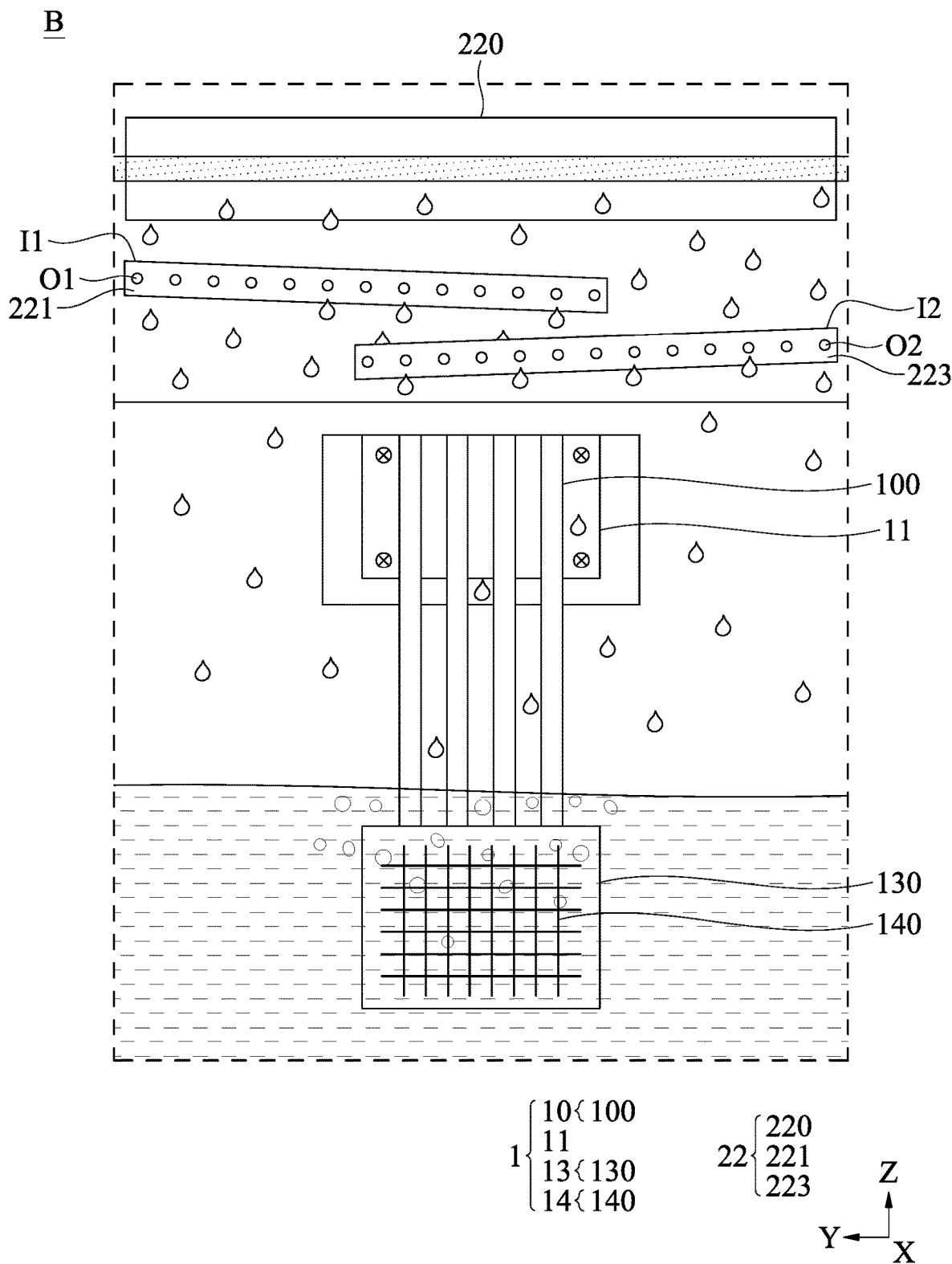
FIG. 9 illustrates a schematic structural view in the first view (i.e., the YZ plane) with respect to the partial section B of the immersion cooling system shown in FIG. 6 according to some embodiments.
Figure 10:
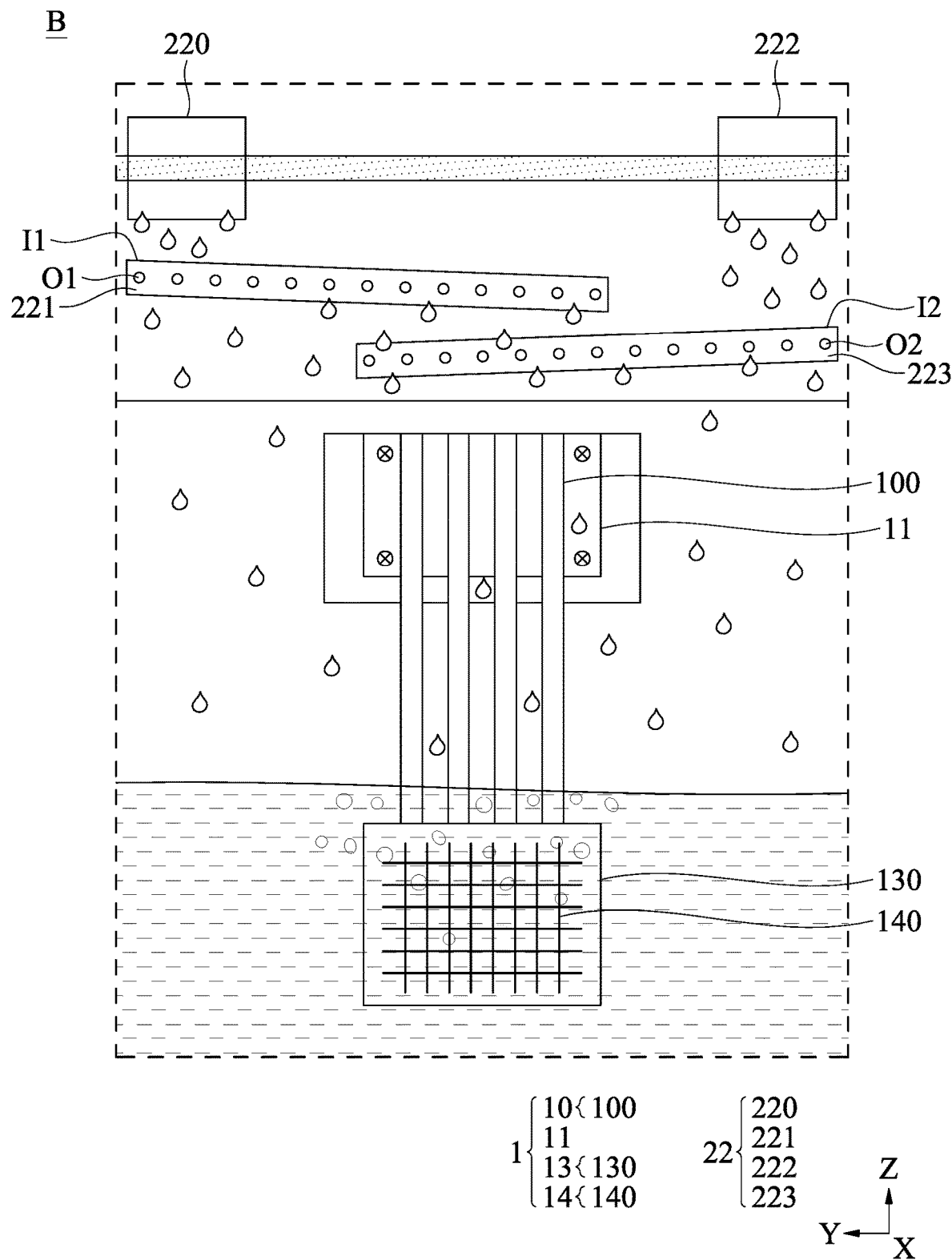
FIG. 10 illustrates a schematic structural view in the first view (i.e., the YZ plane) with respect to the partial section B of the immersion cooling system shown in FIG. 6 according to some embodiments.

In some embodiments, the heat exchange device 22 further comprises a plurality of fluid-guiding elements (e.g., the first fluid-guiding element 221 and the second fluid-guiding element 223 shown in FIG. 9, which will be described later), and each of the fluid-guiding elements is correspondingly adjacent to the condenser(s) 220. Please refer to FIG. 9 and FIG. 10. FIG. 9 and FIG. 10 respectively illustrate schematic structural views in the first view (i.e., the YZ plane) with respect to the partial section B of the immersion cooling system 2 shown in FIG. 6 according to some embodiments. The fluid-guiding elements (e.g., the first fluid-guiding element 221 (which may have the fluid-guiding inlet I1 and the fluid-guiding outlet O1) and the second fluid-guiding element 223 (which may have the fluid-guiding inlet I2 and the fluid-guiding outlet O2) shown in FIG. 9 and FIG. 10) are respectively between the condenser(s) 220 (e.g., the first condenser 220 shown in FIG. 9; or the first condenser 220 and the second condenser 222 shown in FIG. 10) and the at least one portion of the device to be cooled 21 (e.g., the heat source 213 shown in FIG. 7B). Each of the fluid-guiding elements (e.g., the first fluid-guiding element 221 and the second fluid-guiding element 223) may together correspond to the same condenser (e.g., the first condenser 220 shown in FIG. 9) or correspond to a corresponding one of the condensers (e.g., in FIG. 10, the first fluid-guiding element 221 corresponds to the first condenser 220, and the second fluid-guiding element 223 corresponds to the second condenser 222). Moreover, the fluid-guiding inlet I2 and the fluid-guiding outlet O2 may be arranged with reference to the aforementioned embodiments of the fluid-guiding inlet I1 and the fluid-guiding outlet O1, which are thus not described in detail herein. Hence, each of the fluid-guiding elements (e.g., the first fluid-guiding element 221 and the second fluid-guiding element 223) may receive the droplets 203 correspondingly condensed by the corresponding one of the first condenser 220 and the second condenser 222. Therefore, the fluid-guiding elements 221, 223 and the corresponding condensers 220, 222 may be arranged at a plenty of spatial dimensions (e.g., arranged along the Z direction shown in FIG. 9 and/or the X direction shown in FIG. 12; therefore, in some embodiments, the fluid-guiding elements 221, 223 (and the corresponding condensers 220, 222) may be arranged along the Z direction, and the fluid-guiding elements 221, 223 (and the corresponding condensers 220, 222) may also be arranged along the X direction). Hence, in some embodiments, the droplets 203 may be much widely guided to multiple certain locations (which may be, but not limited to, multiple locations above the at least one portion of the devices to be cooled 21, which will be described later). Therefore, according to some embodiments, the droplets 203 may be applied to cool the at least one portion of the devices to be cooled 21 that are in a large amount and densely arranged at the same time, and thus the cooling and dissipation performance provided by the liquid-phase working fluid 201 and the droplets 203 of the liquid-phase working fluid 201 in per unit time period can be thus enhanced.

Figure 12:
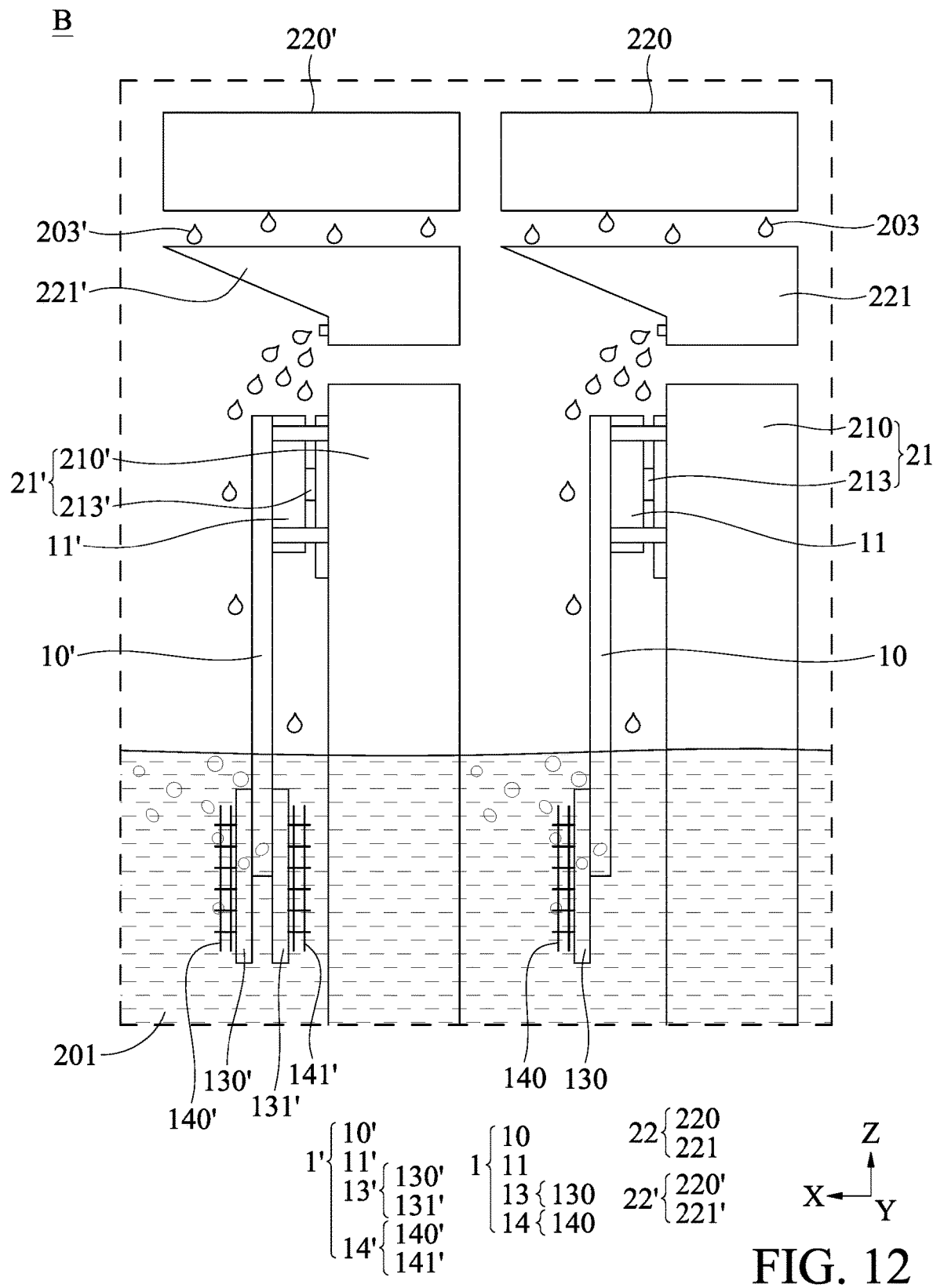
FIG. 12 illustrates a schematic structural view in the second view (i.e., the XZ plane) with respect to the partial section B of the immersion cooling system shown in FIG. 6 according to some embodiments.

Please refer to FIG. 5 and FIG. 12. FIG. 12 illustrates a schematic structural view in the second view (i.e., the XZ plane) with respect to the partial section B of the immersion cooling system 2 shown in FIG. 6 according to some embodiments. In FIG. 5 and FIG. 12, the immersion cooling system 2 may comprise a plurality of devices to be cooled 21, 21', and each of the devices to be cooled 21, 21' may be arranged with reference to the aforementioned embodiments of the devices to be cooled 21, 21', which are thus not further described in detail herein. Furthermore, the device to be cooled 21 may have the corresponding heat exchange device 22 and the fluid-guiding element 221 of the heat exchange device 22, and the device to be cooled 21' may have the corresponding heat exchange device 22' and the fluid-guiding element 221' of the heat exchange device 22'. The fluid-guiding element 221 is between the condenser 220 and the at least one portion of the device to be cooled 21 (e.g., the heat source 213), likewise the fluid-guiding element 221' is between the condenser 220' and the at least one portion of the device to be cooled 21' (e.g., the heat source 213'), and each of the fluid-guiding elements 221, 221' may together correspond to the same condenser 220 (shown in FIG. 5) or correspond to a corresponding one of the condensers 220, 220' (shown in FIG. 12). Therefore, the fluid-guiding element 221 (and/or the fluid-guiding element 221') may receive the droplets 203 (and/or the droplets 203') condensed by the corresponding first condenser 220 (and/or the first condenser 220'). Therefore, the fluid-guiding elements 221, 221' and the corresponding condensers 220, 220' may be arranged for the at least one portion of a plenty of the devices to be cooled 21, 21' (e.g., the heat sources 213, 213'), and the droplets 203, 203' may be much widely guided to multiple certain locations (which may be, but not limited to, multiple locations above the at least one portion of the devices to be cooled 21, 21', such as the heat sources 213, 213'). Hence, according to some embodiments, the droplets 203, 203' may be applied to cool the at least one portion of the devices to be cooled 21, 21' that are in a large amount and densely arranged at the same time, and thus the cooling and dissipation performance provided by the liquid-phase working fluid 201 and the droplets 203, 203' of the liquid-phase working fluid 201 in per unit time period can be thus enhanced.

To sum up, in some embodiments, at least one portion of a device to be cooled (e.g., a heat source) may be arranged in the vapor section (instead of being in the liquid-phase section that contains a liquid-phase working fluid). Therefore, in some embodiments, by connecting a section (e.g., the second section) of a heat conduction element to the at least one portion of the device to be cooled, in assisting of arranging the other section (e.g. the first section) of the heat conduction element in the liquid-phase section, the heat of the at least one portion of the device to be cooled may be guided to the liquid-phase section with a lower temperature even though the at least one portion of a device to be cooled does not contact with the liquid-phase working fluid, thereby cooling the at least one portion of the device to be cooled more effectively. Moreover, in some embodiments, further through a boiling-assisting structure on the other section (e.g., the first section) of the heat conduction element, a heterogeneous nucleation of the liquid-phase working fluid can be formed on the rougher surface with more cavities and gaps of the boiling-assisting structure(s), and bubbles (i.e., the gas-phase working fluid) may be thus formed. Hence, a much larger amount of heat of the heat conduction element and the boiling-assisting structure can be removed by the liquid-phase working fluid and the bubbles thereof in a much shorter time period. Accordingly, in some embodiments, the portion of the device to be cooled that is in the vapor section can be cooled effectively, so that the original work performance and service life of the device to be cooled can be prevented from being affected.

Although the present disclosure is disclosed in the foregoing embodiments as above, it is not intended to limit the instant disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. A two-phase immersion cooling system comprising:
   a work tank having a vapor section and a liquid-phase section, wherein the liquid-phase section is adapted to contain a liquid-phase working fluid;
   a device to be cooled, wherein at least one portion of the device to be cooled is in the vapor section; and
   a heat conduction device comprising:
      a heat conduction element having a closed space adapted to contain a heat conduction fluid to have the heat conduction fluid flow inside the closed space and having a first section and a second section, wherein the first section is in the liquid-phase section, and the second section is connected to the at least one portion of the device to be cooled; and
      a boiling-assisting structure connected to the first section and configured to be exposed to the liquid-phase section of the work tank, thereby causing bubble nucleation at a heterogeneous interface between the boiling-assisting structure and the liquid-phase working fluid.

2. The two-phase immersion cooling system according to claim 1, wherein the heat conduction element is one or more heat conduction pipes, and each of the one or more heat conduction pipes is adapted to contain the heat conduction fluid to allow the heat conduction fluid to flow inside each of the one or more heat conduction pipes.

3. The two-phase immersion cooling system according to claim 1, wherein the heat conduction element is a heat conduction plate having a main surface, wherein the main surface is connected to the device to be cooled, and the heat conduction plate is adapted to contain the heat conduction fluid to allow the heat conduction fluid to flow inside the heat conduction plate.

4. The two-phase immersion cooling system according to claim 1, wherein the liquid-phase working fluid has a fluid temperature, the at least one portion of the device to be cooled has a device temperature, and the device temperature is greater than the fluid temperature.

5. The two-phase immersion cooling system according to claim 1, further comprising one or more boiler plates, wherein each of the one or more boiler plates is on the first section, and each of the one or more boiler plates extends from the heat conduction element along one or more directions away from the heat conduction element, and wherein the boiling-assisting structure is on at least one of the one or more boiler plates, and the boiling-assisting structure on each of the at least one of the one or more boiler plates independently comprises at least one selected from the group consisting of a mesh, metal particles, and a fin.

6. The two-phase immersion cooling system according to claim 1, further comprising one or more boiler plates, wherein each of the one or more boiler plates is on the first section, each of the one or more boiler plates extends from the heat conduction element along one or more directions away from the heat conduction element, and wherein the boiling-assisting structure is on at least one of the one or more boiler plates and covers at least one portion of the first section, and the boiling-assisting structure on each of the at least one of the one or more boiler plates independently comprises at least one selected from the group consisting of a mesh, metal particles, and a fin.

7. The two-phase immersion cooling system according to claim 1, wherein the boiling-assisting structure covers at least one portion of the first section, and the boiling-assisting structure comprises at least one selected from the group consisting of a mesh, metal particles, and a fin.

8. The two-phase immersion cooling system according to claim 1, further comprising a heat exchange device comprising:
   a condenser in the vapor section;
   a condensation pump; and
   a heat exchanger, wherein a first end of the condensation pump is in communication with a first end of the condenser, a second end of the condensation pump is in communication with a first end of the heat exchanger, and a second end of the heat exchanger is in communication with a second end of the condenser.

9. The two-phase immersion cooling system according to claim 8, wherein the heat exchange device further comprises a fluid-guiding element having:
   a fluid-guiding inlet adjacent to the condenser; and
   a fluid-guiding outlet not greater than the fluid-guiding inlet and adjacent to the at least one portion of the device to be cooled.

10. The two-phase immersion cooling system according to claim 1, wherein the heat conduction device further comprises a heat dissipation element, and the heat dissipation element is on a side of the heat conduction element away from the at least one portion of the device to be cooled.

11. The two-phase immersion cooling system according to claim 1, wherein the heat conduction device further comprises a heat-conduction-assisting element, the heat-conduction-assisting element has a first surface and a second surface, the first surface is connected to the second section, and the second surface directly contacts the at least one portion of the device to be cooled.

12. The two-phase immersion cooling system according to claim 11, wherein the device to be cooled comprises:
   a substrate;
   a heat source on the substrate; and
   a fixing element, wherein a first end of the fixing element is connected to the substrate, and a second end of the fixing element is connected to the heat-conduction-assisting element, so that the second surface of the heat-conduction-assisting element covers the heat source.

13. The two-phase immersion cooling system according to claim 12, wherein the device to be cooled further comprises a holding seat, and the substrate is on the holding seat.

14. A heat conduction device for two-phase immersion cooling system, wherein the two-phase immersion cooling system has a vapor section, a liquid-phase section, and a device to be cooled, the liquid-phase section is adapted to contain a liquid-phase working fluid, at least one portion of the device to be cooled is in the vapor section, and wherein the heat conduction device comprises:
   a heat conduction element having a closed space adapted to contain a heat conduction fluid to have the heat conduction fluid flow inside the closed space and having a first section and a second section, wherein the first section is in the liquid-phase section, and the second section is connected to the at least one portion of the device to be cooled; and
   a boiling-assisting structure connected to the first section and configured to be exposed to the liquid-phase section of the two-phase immersion cooling system, thereby causing bubble nucleation at a heterogeneous interface between the boiling-assisting structure and the liquid-phase working fluid.

15. The heat conduction device according to claim 14, wherein the heat conduction element is one or more heat conduction pipes, and each of the one or more heat conduction pipes is adapted to receive the heat conduction fluid to allow the heat conduction fluid to flow inside each of the one or more heat conduction pipes.

16. The heat conduction device according to claim 14, wherein the heat conduction element is a heat conduction plate having a main surface, wherein the main surface is connected to the device to be cooled, and the heat conduction plate is adapted to contain the heat conduction fluid to allow the heat conduction fluid to flow inside the heat conduction plate.

17. The heat conduction device according to claim 14, wherein the liquid-phase working fluid has a fluid temperature, the at least one portion of the device to be cooled has a device temperature, and the device temperature is greater than the fluid temperature.

18. The heat conduction device according to claim 14, further comprising one or more boiler plates, wherein each of the one or more boiler plates is on the first section, and each of the one or more boiler plates extends from the heat conduction element along one or more directions away from the heat conduction element, and wherein the boiling-assisting structure is on at least one of the one or more boiler plates, and the boiling-assisting structure on each of the at least one of the one or more boiler plates independently comprises at least one selected from the group consisting of a mesh, metal particles, and a fin.

19. The heat conduction device according to claim 14, further comprising one or more boiler plates, wherein each of the one or more boiler plates is on the first section, each of the one or more boiler plates extends from the heat conduction element along one or more directions away from the heat conduction element, and wherein the boiling-assisting structure is on at least one of the one or more boiler plates and covers at least one portion of the first section, and the boiling-assisting structure on each of the at least one of the one or more boiler plates independently comprises at least one selected from the group consisting of a mesh, metal particles, and a fin.

20. The heat conduction device according to claim 14, wherein the boiling-assisting structure covers at least one portion of the first section, and the boiling-assisting structure comprises at least one selected from the group consisting of a mesh, metal particles, and a fin.

21. A heat conduction device comprising:
   a heat conduction element having a closed space adapted to contain a heat conduction fluid to have the heat conduction fluid flow inside the closed space, wherein the heat conduction element has:
      a first section; and
      a second section away from the first section and adapted to be connected to at least one portion of a device to be cooled, wherein the at least one portion of the device to be cooled is adapted to be disposed in a vapor section of a two-phase immersion cooling system; and
   a boiling-assisting structure connected to the first section and configured to be exposed to a liquid-phase section of the two-phase immersion cooling system, thereby causing bubble nucleation at a heterogeneous interface between the boiling-assisting structure and the liquid-phase working fluid of the liquid-phase section.

22. The heat conduction device according to claim 21, further comprising one or more boiler plates, wherein each of the one or more boiler plates is on the first section, the boiling-assisting structure is on at least one of the one or more boiler plates, and the boiling-assisting structure on each of the at least one of the one or more boiler plates independently comprises at least one selected from the group consisting of a mesh, metal particles, and a fin.

23. The heat conduction device according to claim 21, further comprising one or more boiler plates, wherein each of the one or more boiler plates is on the first section, the boiling-assisting structure is on at least one of the one or more boiler plates and covers at least one portion of the first section, and the boiling-assisting structure on each of the at least one of the one or more boiler plates independently comprises at least one selected from the group consisting of a mesh, metal particles, and a fin.

24. The heat conduction device according to claim 21, wherein the boiling-assisting structure covers at least one portion of the first section, and the boiling-assisting structure comprises at least one selected from the group consisting of a mesh, metal particles, and a fin.

25. The heat conduction device according to claim 21, further comprising a heat-conduction-assisting element and a fixing element, wherein the heat-conduction-assisting element has a first surface and a second surface, and the fixing element is adapted to fix the first surface to the second section, so that the second surface covers the device to be cooled.

26. The heat conduction device according to claim 21, wherein the heat conduction element is at least one of one or more heat conduction pipes and a heat conduction plate;
wherein each of the one or more heat conduction pipes is adapted to contain the heat conduction fluid to allow the heat conduction fluid to flow inside each of the one or more heat conduction pipes;
the heat conduction plate has a main surface, wherein the main surface is connected to the device to be cooled, and the heat conduction plate is adapted to contain the heat conduction fluid to allow the heat conduction fluid to flow inside the heat conduction plate.

\* \* \* \* \*